United States Patent
Shinohara et al.

(10) Patent No.: US 12,310,080 B2
(45) Date of Patent: May 20, 2025

(54) LATERALLY-GATED TRANSISTORS AND LATERAL SCHOTTKY DIODES WITH INTEGRATED LATERAL FIELD PLATE STRUCTURES

(71) Applicant: Teledyne Scientific & Imaging, LLC, Thousand Oaks, CA (US)

(72) Inventors: Keisuke Shinohara, Thousand Oaks, CA (US); Casey King, Newbury Park, CA (US); Eric Regan, Moorpark, CA (US); Miguel Urteaga, Moorpark, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 18/609,778

(22) Filed: Mar. 19, 2024

(65) Prior Publication Data
US 2024/0258384 A1    Aug. 1, 2024

Related U.S. Application Data

(62) Division of application No. 17/022,521, filed on Sep. 16, 2020, now Pat. No. 11,967,619.

(51) Int. Cl.
*H10D 30/47*    (2025.01)
*H10D 8/60*     (2025.01)
*H10D 64/00*    (2025.01)

(52) U.S. Cl.
CPC ............ *H10D 64/112* (2025.01); *H10D 8/60* (2025.01); *H10D 30/47* (2025.01)

(58) Field of Classification Search
CPC ............ H01L 29/0649; H01L 29/2003; H01L 29/404; H01L 29/42316; H01L 29/7786;
(Continued)

(56) References Cited

U.S. PATENT DOCUMENTS

| 9,368,622 | B1 | 6/2016 | Boutros |
| 11,967,619 | B2 | 4/2024 | Shinohara et al. |

(Continued)

OTHER PUBLICATIONS

International Search Report and Written Opinion of the International Searching Authority for PCT/US2021/045170 mailed Jan. 7, 2022.
(Continued)

*Primary Examiner* — Eric A. Ward
(74) *Attorney, Agent, or Firm* — K&L Gates LLP

(57) ABSTRACT

Laterally-gated transistors and lateral Schottky diodes are disclosed. The FET includes a substrate, source and drain electrodes, channel, a gate electrode structure, and a dielectric layer. The gate electrode structure includes an electrode in contact with the channel and a lateral field plate adjacent to the electrode. The dielectric layer is disposed between the lateral field plate and the channel. The lateral field plate contacts the dielectric layer and to modulate an electric field proximal to the gate electrode proximal to the drain or source electrodes. Also disclosed is a gate electrode structure with lateral field plates symmetrically disposed relative to the gate electrode. Also disclosed in a substrate with dielectric structures buried in the substrate remote from the gate electrode structure. A lateral Schottky diode having an anode structure includes an anode (A), cathodes (C) and lateral field plates located between the anode and the cathodes.

18 Claims, 16 Drawing Sheets

(58) Field of Classification Search
CPC ......... H01L 29/872; H01L 29/402–407; H01L 29/4236; H01L 29/66431; H01L 29/66462; H01L 29/778–7789
See application file for complete search history.

(56) References Cited

U.S. PATENT DOCUMENTS

| | | | |
|---|---|---|---|
| 2009/0242943 A1* | 10/2009 | Kawasaki | ......... H01L 29/66462 257/280 |
| 2010/0219452 A1 | 9/2010 | Brierley | |
| 2013/0341680 A1 | 12/2013 | Senda | |
| 2014/0097471 A1* | 4/2014 | Briere | ................... H01L 29/402 257/194 |
| 2015/0162424 A1 | 6/2015 | Briere | |
| 2015/0194512 A1 | 7/2015 | Ohki et al. | |
| 2016/0126340 A1 | 5/2016 | Nechay et al. | |
| 2016/0293713 A1 | 10/2016 | Nechay et al. | |
| 2017/0148912 A1 | 5/2017 | Chu | |
| 2019/0013386 A1 | 1/2019 | Shinohara et al. | |
| 2019/0229208 A1 | 7/2019 | Matioli et al. | |
| 2021/0167202 A1 | 6/2021 | Lu et al. | |
| 2023/0143585 A1* | 5/2023 | Nakamura | .......... H01L 29/2003 257/76 |

OTHER PUBLICATIONS

Chini et al. "High Breakdown Voltage AlGaN—GaN HEMTs Achieved by Multiple Field Plates", IEEE Electron Device Letters, IEEE, USA, vol. 25, No. 4, Apr. 2004, pp. 161-163.

Shinohara et al., "GaN-Based Field-Effect Transistors With Laterally Gated Two-Dimensional Electron Gas," IEEE Electron Device Letters, vol. 39, No. 3, Mar. 2018, pp. 417-420.

Lee et al., "Nanowire Channel InAlN/GaN HEMTs With High Linearity of gm and fT" IEEE Electron Device Letters, vol. 34, No. 8, Aug. 2013, pp. 969-971.

Chang et al., "The Super-Lattice Castellated Field-Effect Transistor: A High-Power, High-Performance RF Amplifier," IEEE Electron Device Letters, vol. 40, No. 7, Jul. 2019, pp. 1048-1051.

\* cited by examiner

LATERALLY-GATED TRANSISTORS AND LATERAL SCHOTTKY DIODES WITH INTEGRATED LATERAL FIELD PLATE STRUCTURES

CROSS REFERENCE TO RELATED APPLICATIONS

This application is a divisional application filed under 35 U.S.C. § 121 of U.S. patent application Ser. No. 17/022,521 entitled "LATERALLY-GATED TRANSISTORS AND LATERAL SCHOTTKY DIODES WITH INTEGRATED LATERAL FIELD PLATE STRUCTURES" filed on Sep. 16, 2020, the disclosure of which is incorporated herein by reference in its entirely and for all purposes.

STATEMENT REGARDING FEDERALLY SPONSORED RESEARCH AND DEVELOPMENT

This invention was made with government support under contract FA8650-18-7807 awarded by DARPA. The government has certain rights in the invention.

TECHNICAL FIELD

This disclosure relates generally to field-effect transistors (FETs) with lateral field plates. More particularly, this disclosure relates to laterally-gated transistors with lateral field plates to modulate an electric field near a drain-end of a lateral gate in single- or multiple-channel transistors.

BACKGROUND

In most conventional FETs, the gate electrode is disposed on top of the semiconductor surface to modulate the drain current by a vertical gate electric field. This forms a region at the drain end of the gate where an electric field strength becomes the largest during high voltage operation. This is a main cause of problems for traditional FETs. For example, current collapse caused by electron trapping near the high electric field region degrades power performance of the FET when it is biased at high drain voltages. This degrades RF power performance (output power, efficiency, linearity, gain) of FETs when they are operated to provide a large voltage swing. For GaN-based high electron mobility transistors (HEMTs) with strong piezoelectricity, the high vertical electric field at the drain end of the gate can cause cracks in the epitaxial layers by inducing tensile stress in the top barrier material (so-called "inverse piezoelectric effect"). This effect limits the reliability of GaN-based HEMTs. Other considerations regarding conventional FETs include device breakdown when the electric field strength exceeds the critical field of the materials and degraded device reliability due to defect formation by the high electric field at the drain end of the gate. Similar considerations apply to laterally-gated transistors.

In a conventional top-gated HEMT with a field plate, a dielectric layer is inserted between the field plate and the channel. The field plate alleviates an electric field near the drain-side of the gate contact. A conventional laterally-gated transistor can contain multiple channels to increase power density and current handling and to decrease transistor's on-resistance for high-power RF and power switching applications. Other transistors that employ lateral gates include FIN FETs, SLC FETs, and BRIDGE HEMT by Teledyne Scientific & Imaging, LLC.

SUMMARY

In one aspect, the present disclosure provides a field-effect transistor (FET) comprising a substrate, source and drain electrodes on the substrate, a channel layer, a gate electrode structure, and a dielectric layer. The gate electrode structure comprises a gate electrode and a lateral field plate adjacent to the gate electrode. The gate electrode is in contact with the channel layer. The dielectric layer is disposed between the lateral field plate and the channel layer. The lateral field plate is in contact with the dielectric layer and is configured to modulate an electric field proximal to the gate electrode proximal to at least one of or both the drain or source electrodes.

In another aspect, the present disclosure provides a field-effect transistor (FET) comprising a substrate, source and drain electrodes on the substrate, a channel layer, a gate electrode structure, and a dielectric layer. The gate electrode structure comprises a gate electrode, a first lateral field plate adjacent to one side of the gate electrode, and a second lateral field plate adjacent to an opposite side of the gate electrode. The gate electrode is in contact with the channel. The dielectric layer is disposed between the first and second lateral field plates and the channel layer. The first and second lateral field plates are disposed in a symmetrical arrangement relative to the gate electrode. The first and second lateral field plates are in contact with the dielectric layer and are configured to modulate an electric field proximal to the gate electrode proximal to at least one of or both the drain or source electrodes.

In another aspect, the present disclosure provides a field-effect transistor (FET) comprising a substrate, source and drain electrodes on the substrate, a channel layer, a gate electrode structure, a dielectric layer, and a dielectric structure buried in the substrate remote from the gate electrode structure. The gate electrode structure comprises a gate electrode and a lateral field plate adjacent to the gate electrode. The gate electrode is in contact with the channel layer. The dielectric layer is disposed between the lateral field plate and the channel layer. The lateral field plate is in contact with the dielectric layer and is configured to modulate an electric field proximal to the gate electrode proximal to at least one of or both the drain or source electrodes.

In various aspects, the FET may be, buried gate HEMT, FIN FET, or SLC FET.

In another aspect, the present disclosure provides a lateral Schottky diode, comprising: a substrate comprising a plurality of structures buried in apertures disposed in the substrate; an anode structure comprising: an anode; and lateral field plates; and a cathode located on a top surface of the substrate.

The foregoing is a summary and thus may contain simplifications, generalizations, inclusions, and/or omissions of detail; consequently, those skilled in the art will appreciate that the summary is illustrative only and is NOT intended to be in any way limiting. Other aspects, features, and advantages of the devices and/or processes and/or other subject matter described herein will become apparent in the teachings set forth herein.

In one or more various aspects, related systems include but are not limited to circuitry in virtually any combination of hardware to affect the herein-referenced transistors depending upon the design choices of the system designer. In addition to the foregoing, various other aspects are set forth and described in the teachings such as text (e.g., claims and/or detailed description) and/or drawings of the present disclosure.

Further, it is understood that any one or more of the following-described forms, expressions of forms, examples, can be combined with any one or more of the other following-described forms, expressions of forms, and examples.

The foregoing summary is illustrative only and is not intended to be in any way limiting. In addition to the illustrative aspects, embodiments, and features described above, further aspects, embodiments, and features will become apparent by reference to the drawings and the following detailed description.

FIGURES

The novel features of the described forms are set forth with particularity in the appended claims. The described forms, however, both as to organization and methods of operation, may be best understood by reference to the following description, taken in conjunction with the accompanying drawings in which:

DESCRIPTION

Figure 1:
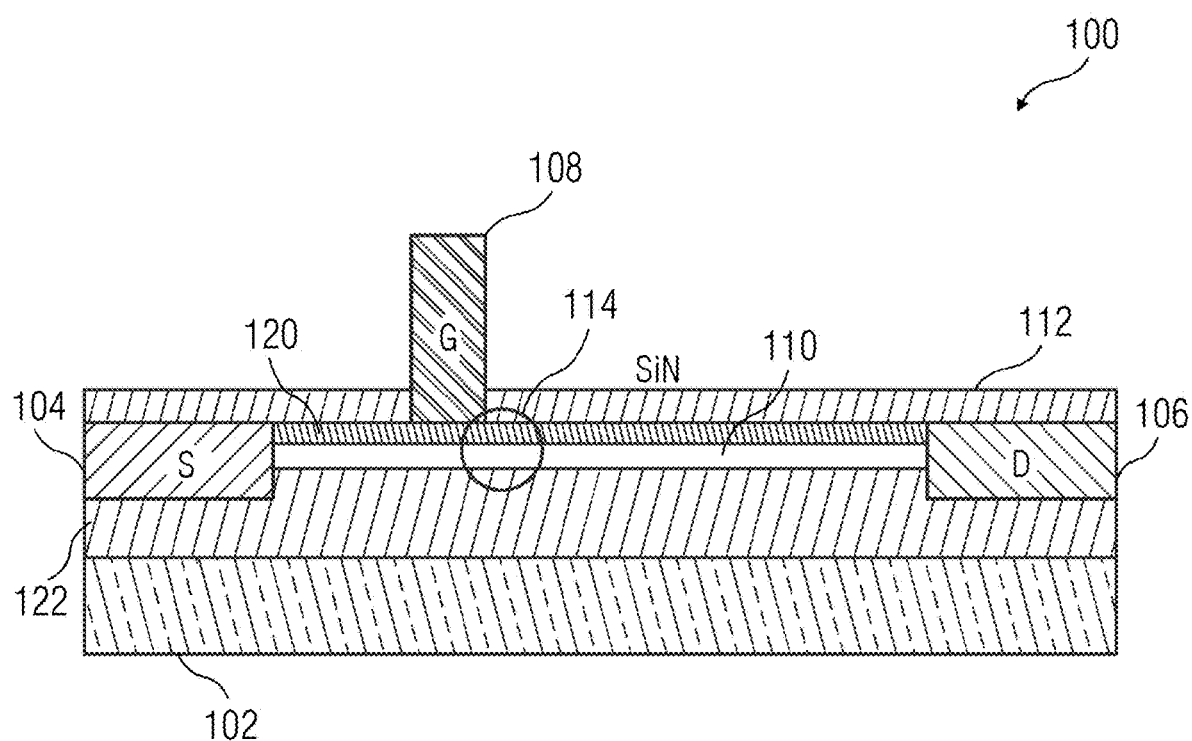
FIG. 1 is a cross-sectional view of a top gate HEMT with a gate electrode without a lateral field plate.

Before explaining various forms of electronic devices in detail, it should be noted that the illustrative forms are not limited in application or use to the details of construction and arrangement of parts illustrated in the accompanying drawings and description. The illustrative forms may be implemented or incorporated in other forms, variations and modifications, and may be practiced or carried out in various ways. Further, unless otherwise indicated, the terms and expressions utilized herein have been chosen for the purpose of describing the illustrative forms for the convenience of the reader and are not for the purpose of limitation thereof.

Further, it is understood that any one or more of the following-described forms, expressions of forms, examples, can be combined with any one or more of the other following-described forms, expressions of forms, and examples.

In one general aspect, this disclosure provides a FET comprising a gate electrode comprising a lateral field plate. In one aspect, the lateral field plate can be integrated in the FET during the fabrication process. This disclosure is applicable to any FET comprising single or multiple current conducting channels.

In one aspect the FET can be a laterally-gated transistor. In one aspect, the laterally-gated transistor may be a top gate HEMT comprising a lateral field plate and a dielectric layer disposed between the lateral field plate and the single or multiple current conducting channel defining a field plate region where a thickness of the dielectric layer determines a pinch-off voltage in the field plate region. A thickness of the dielectric layer determines the pinch-off voltage in the field plate region. The lateral field plate alleviates the electric field near the drain electrode end of the gate electrode when the device is biased at a high drain voltage, increasing breakdown voltage, and suppressing current collapse. In one aspect, the top-gate HEMT comprises an integrated lateral field plate structure in contact with the substrate and the dielectric layer. The dielectric layer is located on a top layer of the substrate.

In another aspect, the laterally-gated transistor can be a buried gate HEMT comprising a lateral field plate. The buried gate electrode of the buried gate HEMT contacts laterally with the single or multiple conducting channels and modulates the channel width laterally with gate voltage bias. The lateral field plate is adjacent to the gate electrode with a dielectric layer disposed on sidewalls between the lateral field plate and the single or multiple conducting channel. The lateral field plate is configured to modulate an electric field proximal to a field plate region proximal the gate electrode proximal to at least one of the drain or source electrodes. A thickness of the dielectric layer deposited on the sidewalls is uniform in the depth direction to enable a distance between the lateral field plate and the single or multiple conducting channel to be uniform for the singe or multiple channel. In one aspect, the laterally-gated transistor can be a buried gate HEMT comprising a lateral field plate according to the present disclosure may be employed to increase transistor power density and current handling and to decrease the on-resistance of the transistor for both RF and power switching applications.

Various lateral field plate configurations may be employed depending on the application. The following applications are not limiting. For RF power amplification and power switching device, field plates may be located asymmetrically only on the drain electrode side of the gate electrode where the electric field peaks. For RF switch devices where the gate-to-source and the gate-to-drain voltages are applied equally, symmetric lateral field plates are applicable where the lateral field plate is adjacent to the gate electrode proximal to at least one of or both the drain or source electrodes.

In one aspect, the laterally gated transistor comprises an integrated lateral field plate structure adjacent to the gate electrode proximal to at least one of or both the drain or source electrodes with a dielectric layer contacting the entire sidewall except where the gate electrode contacts the substrate.

In another aspect, a laterally gated transistor comprises an integrated lateral field plate structure adjacent to the gate electrode proximal to at least one of the drain or source electrodes with a dielectric layer contacting the entire sidewall except where the gate contacts the substrate. The dielectric layer also contacts the lateral sides of the gate electrode proximal to at least one of or both the drain or source electrodes.

In yet another aspect, the present disclosure provides a laterally gated transistor comprising an integrated field plate structure adjacent to the gate electrode proximal to at least one of or both the drain or source electrodes and a field plate is adjacent to the gate on the source-end of the gate. A dielectric layer contacts the sidewall except where the gate electrode contacts the substrate.

In another aspect, the present disclosure provides a laterally gated transistor comprising an integrated field plate structure adjacent to the gate electrode proximal to at least one of or both the drain or source electrodes. A second field plate is adjacent to the first field plate. A dielectric layer contacts the sidewall except where the gate contacts the substrate. A second dielectric layer contacts the first dielectric layer.

In another aspect, the present disclosure provides a laterally gated transistor comprising an integrated field plate structure adjacent to the gate on the drain-end of the gate. A second field plate is adjacent to the first field plate. A dielectric layer contacts the entire sidewall except where the gate contacts the substrate. The dielectric layer also contacts the gate electrode proximal t at least one or both the drain or source electrodes. A second dielectric layer contacts the first dielectric layer.

In yet another aspect, the present disclosure provides a laterally gated transistor comprising a first field plate adjacent to the gate electrode proximal to at least one of or both the drain or source electrodes and a second field plate adjacent to the gate electrode proximal to the at least one of or both the drain or source electrodes. A third field plate adjacent to the gate electrode proximal to at least of one or both the drain or source electrodes and a fourth field plate adjacent to the third field plate proximal to at least one or both the drain or source electrodes. A dielectric layer contacts the sidewall except where the gate electrode contacts the substrate. A second dielectric layer contacts the first dielectric layer.

In another aspect, the present disclosure provides a buried nitride structure embedded in the substrate of a laterally gated transistor in addition to an integrated field plate structure contacting laterally with the channels through a gate dielectric layer. The buried nitride structure enhances breakdown voltage and reduces the gate to drain capacitance.

The lateral field plate modulates the electric field in a field plate region proximal to at least one of or both the drain or source electrodes in one or multiple channels simultaneously. The lateral field plate alleviates electric field strength in the field plate region proximal to at least one of or both the drain or source electrodes. The lateral field plate, due to the alleviated electric field strength at the drain electrode end of the gate electrode, enables increased breakdown voltage, reduced off-state gate leakage current, suppressed current collapse and knee walkout during large-signal operation of the transistors, and suppressed dynamic on-resistance increase during high-voltage switching operation of the transistors.

The laterally-gated transistors comprising integrated lateral field plate structures according to the present disclosure can be applied to any type of laterally gated transistors made of any type of semiconductor material such as InAlGaAs, InAlN, InGaSb, SiGe/Si, Ga2O3, or AlGaOx. In addition, the laterally-gated transistors with integrated lateral field plate structures according to the present disclosure may be applicable to a wide range of RF products such as power amplifiers, low-noise amplifiers, low-loss RF switches, power converters with a low-loss and a high-blocking voltage.

In various aspects, the laterally-gated transistors comprises integrated lateral field plate structures according to the present disclosure may be applicable to RF transistors used in power amplifiers with high output power, high efficiency, high linearity with high reliability at a wide range of frequencies from S-band to W-band. In various aspects, the laterally-gated transistors comprising integrated lateral field plate structures may be applied to reliable RF power amplifiers with an unprecedented combination of output power, efficiency, and linearity. The laterally-gated transistors comprising integrated lateral field plate structures according to the present disclosure also may be applied to robust low noise amplifiers with high linearity.

In one aspect, the laterally-gated transistors with integrated lateral field plate structures according to the present disclosure may be applicable to RF transistors used in RF switches with low insertion loss and high isolation. In another aspect, the laterally-gated transistors with integrated lateral field plate structures according to the present disclosure may be applied to power switches with low dynamic on-resistance and breakdown voltages. In yet another aspect, the laterally-gated transistors comprising integrated lateral field plate according to the present disclosure may be applied to low insertion-loss RF switches with high isolation and power handling capability. The laterally-gated transistors comprising integrated lateral field plate structures according to the present disclosure can produce power switches with high power conversion efficiency at high voltages, such as over 600V, for example.

In one aspect, the laterally-gated transistors with integrated lateral field plate structures according to the present disclosure may be applied to RF transistors used in diodes with a low series resistance and a high breakdown voltage.

In various aspects, the laterally-gated transistors comprising integrated lateral field plate structures according to the present disclosure may be applied to FinFETs or other type of non-planar transistors, or "3D" transistors, super lattice castellated (SLC) FETs, and buried gate HEMTs.

Figure 2:
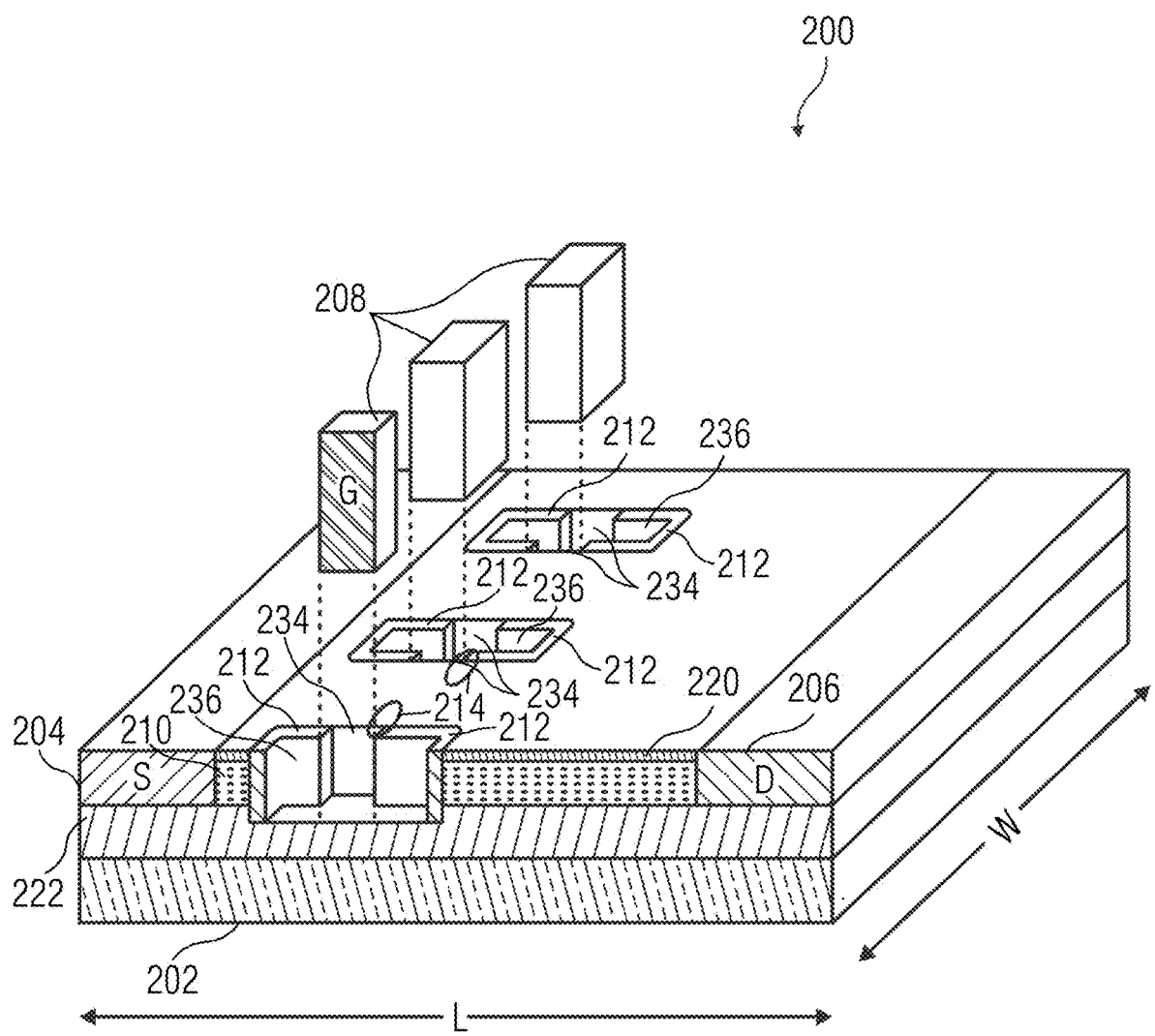
FIG. 2 is a perspective sectional view of a buried gate HEMT with a gate electrode without a lateral field plate.

Turning now to the figures, where FIG. 1 is cross-sectional views of a top gate HEMT 100 with a gate electrode 108 without a lateral field plate and FIG. 2 is a perspective sectional view of a buried gate HEMT 200 without a lateral field plate. In the conventional planar HEMT shown in FIG. 1, a buffer layer 122, a channel 110, and a top barrier layer 120 have been grown on a substrate 102. Source and drain electrodes 104, 106 are on a top surface of the substrate 102, along with a gate electrode 108. As used herein, the "top surface" of the substrate 102 refers to a surface of the uppermost epitaxial layer that has been grown on the substrate 102. In operation, in the ON-state, a voltage applied to the gate electrode 108 creates a vertical electric field which affects the depletion of the channel 110, thereby controlling the current flow between source and drain electrodes 104, 106. Drain current is controlled by electron density modulation, with electrons flowing under the foot of the gate electrode 108. One drawback of this conventional design is that in the OFF-state, there may be a leakage current when the source-drain voltage is high, due to source-drain punch through.

A dielectric layer 112 is located on the top surface of the substrate 102. The dielectric layer 112 is in contact with the substrate 102, the source electrode 104, and the drain electrode 106. The gate electrode 108 disposed on the top of the semiconductor substrate 102 modulates the drain current by a vertical gate field. This forms a region 114 at the drain electrode 106 end of the gate electrode 108 where an electric field strength becomes the largest during high voltage operation. The high electric field strength in this region 114 causes current collapse by electron trapping at the semiconductor surface and degrades the power performance of the top gate HEMT 100 when it is biased at high drain voltages.

FIG. 2 is a perspective sectional view of a buried gate HEMT 200 with a buried gate electrode 208 without a lateral field plate. In this illustrated example, the FET is a buried gate HEMT in which the drain current is carried via a 2 DEG plane within a channel 210. As shown, the channel 210 comprises multiple conducting channels. The buried gate HEMT 200 comprises a substrate 202, an epitaxial buffer layer 222, a 2 DEG plane within an epitaxial channel 210, an epitaxial top barrier layer 220, and source and drain electrodes 204, 206 on a top surface of the substrate 202. However, instead of a gate electrode 108 on the surface of the substrate 102 as shown in FIG. 1, here the gate electrode comprises a plurality of buried gate electrode 208, the tops of which extend above the top surface of the substrate 202 and the bottoms of which are buried to a depth at least equal to that of the bottom of 2 DEG plane of the channel 210 between a dielectric layer 212 disposed on the sidewalls of the channel 210. The buried gate electrode 208 also includes a head portion above (not shown) and not in contact with the top surface of the substrate, which contacts and interconnects all of the buried gate electrode 208. Thus, the buried gate electrodes 208 contact the 2 DEG plane of the channel 210 only from the sides. When so arranged, the drain current of the FET is controlled by channel width modulation by lateral gating of the 2 DEG plane of the channel 210 by the buried gate electrode 208. The drain current in the ON-state is controlled by channel width modulation, and the device exhibits excellent electrostatic isolation in the OFF-state because the buried gate electrode 208 laterally extend the depletion region under the 2 DEG plane of the channel 210.

In the example depicted in FIG. 2, the gate electrodes 208 are rectangularly shaped. A dielectric layer 212 is disposed on the inner sidewalls of aperture 236 defined in the substrate 202 where the bottoms of the gate electrode 208 are buried in the substrate 202. The lateral sides of the bottom of the gate electrode 208 are received in the apertures 236 through gaps 234 defined in the dielectric layer 212 between the elongated sides of the apertures 236. The dielectric layer 212 surrounds the edge of the aperture 236 containing the gate electrode 208 except where the gaps 234 are defined.

Electrons flow between the buried gate electrode 208, with the width of the channels (Wch), measured between the buried gate electrode 208 along the width (W) of the substrate 202, controlled by the depletion induced by the lateral sides of the bottom of the buried gate electrode 208, and by the pitch ("Pg-g") between adjacent buried gate electrode 208. The preferably nanometer-scale parallel channels reduce self-heating during large signal operation by spatially distributing the heat sources. The width (W) is transverse to the length L of the substrate 202. The buried gate electrode 208 contact laterally with the channel(s) defined between the gate electrode 208 along the width (W) and modulate the channel widths Wch laterally with the gate bias.

When the FET is a HEMT 200 as illustrated in FIG. 2, the channel 210 comprises a 2 DEG plane. The length of the channel is measured along the length L of the device. For this type of FET, the bottoms of buried gate electrode 208 should be buried at least to the bottom of the 2 DEG plane of the channel 210. As the 2 DEG plane occupies only the upper portion of the channel layer, the bottoms of the buried gate electrode 208 can be within the channel 210, or even in the buffer layer 222.

The depth to which the buried gate electrode 208 should be buried depends on the device type. As noted above, for the HEMT 200 shown in FIG. 2, the bottoms of the buried gate electrode 208 should be buried to a depth at least equal to the bottom of the current-carrying 2 DEG plane in the channel 210. If the device is a MESFET, the buried gate electrode 208 could be buried to a depth at least equal to the bottom of the channel 210. In general, the buried gate electrode 208 must be buried deep enough so that they contact the current-carrying portion of the channel 210 only from its sides, such that the drain current of the FET is controlled by channel width modulation by lateral gating of the current-carrying layer by the buried gate electrode 208.

As noted above, a FET employing buried gate electrode 208 as described herein controls drain current via channel width modulation, by laterally gating the channel 210. The laterally extended depletion region under the channel 210 enhances electrostatic isolation, and reduces leakage current and drain-induced barrier lowering (DIBL) in the off-state; it also reduces output conductance in on-state, thereby improving transistor gain. Effective source and drain resistances are very small (~⅕ those of planar HEMTs) because the source and drain contact width is wider than the effective channel width, thereby reducing the knee voltage. In addition, having no contact between the top of substrate 202 and the head portion (not shown) suppresses the electron trapping effect during large signal operation, and eliminates the inverse piezoelectric effect.

The buried gate electrode 208 can have any of a number of shapes. For example, the structures may be cylindrical. They might also be, for example, rectangular, or any other suitable shape.

As shown in FIG. 2, the plurality of buried gate electrode 208 may lie along a line which is parallel to and between the source and drain electrodes 204, 206, though this is not essential. In this example, the buried gate electrode 208 are evenly spaced along said line (i.e., the buried gates have a fixed pitch). As FET characteristics such as threshold voltage vary with pitch, the fixed pitch can be selected as needed to achieve desired performance characteristics.

The dielectric layer 212 is in contact with the sidewalls of the channel 210 where the bottoms of the buried gate electrode 208 are buried in the channel 210. The dielectric layer 212 also is in contact with the top surface of the substrate 202. The buried gate electrode 208 modulate the drain current by a vertical gate field. This forms a region 214 at the drain electrode 206 end of the buried gate electrode 208 where an electric field strength becomes the largest during high voltage operation. The high electric field strength in this region 214 causes current collapse by electron trapping at the semiconductor surface and degrades the power performance of the top gate HEMT 200 when it is biased at high drain voltages.

As described hereinbelow, to alleviate the high electric field strength in regions 114, 214 as shown in FIGS. 1 and 2, lateral field plate structures are integrated with the gate electrode structures 108, 208 and a dielectric layer 112, 212 is inserted in between the lateral field plate structure and the channel 110, 210. The thickness of the dielectric layer 112, 212 determines the pinch-off voltage in the field plate structure region 114, 214. The field plate alleviate the electric field in the regions 114, 214 near the drain electrode 106, 206 end of the gate electrode structures 108, 208 when the device is biased at a high drain voltage, increasing breakdown voltage and suppressing current collapse.

Laterally-gated transistors with multiple channels 210, as shown in FIG. 2, for example, increase the power density and current handling of the transistor to decrease the on-resistance of the transistor for both RF and power switching applications. In the laterally-gated transistors, the field lateral field plate structures contacts laterally with the channel(s) 110, 210 through a gate dielectric layer 112, 212 (SiN, SiO2, SiON, AlN, Al2O3, AlON, HfO2, HfN, HfON, etc.). The thickness of the gate dielectric layer 212 deposited on the sidewalls is made to be the same in the depth direction, enabling the distance between the lateral field plate structure and the channel 210 to be the same for multiple channels.

Additional description of top gated HEMT and buried gate HEMT devices is provided in commonly owned Publication No. US 2019/0013386 A1, the disclosure of which is herein incorporated by reference in its entirety. Although HEMTs are depicted in the examples shown, the lateral field plate structures described herein could be applied to other FET types, including MESFETs and Metal Insulator Semiconductor FETs (MISFETs), FIN FETS, SLG FETS, among other. Various FET transistors comprising various configurations of lateral field structures are described hereinbelow in connection with FIGS. 3-12.

Figure 3:
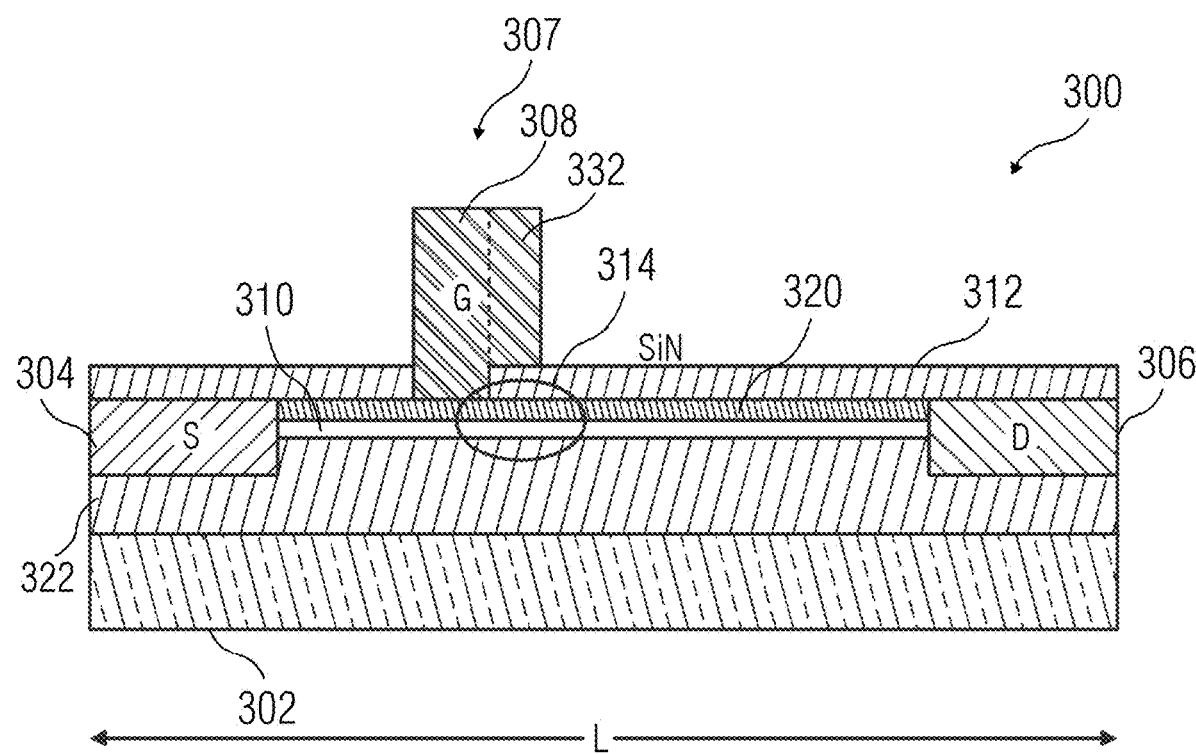
FIG. 3 is a cross-sectional view of a top gate HEMT with a gate electrode structure comprising a gate electrode and a single lateral field plate according to at least one aspect of the present disclosure.

FIG. 3 is a cross-sectional view of a top gate HEMT 300 with a gate electrode structure 307 comprising a gate electrode 308 and a lateral field plate 332 according to at least one aspect of the present disclosure. In the illustrated example, the top gate HEMT 300 HEMT shown in FIG. 1, a buffer layer 322, a channel layer 320, and a top barrier layer 310 have been grown on a substrate 302. Source and drain electrodes 304, 306 are on a top surface of the substrate 302, along with a gate electrode structure 307 comprising a gate electrode 308 and a lateral field plate 332. As used herein, the "top surface" of the substrate 302 refers to a surface of the uppermost epitaxial layer that has been grown on the substrate 302. In operation, in the ON-state, a voltage applied to the gate electrode 308 creates a vertical electric field which affects the depletion of the channel layer 320, thereby controlling the current flow between source and drain electrodes 304, 306. Drain current is controlled by electron density modulation, with electrons flowing under the foot of the gate electrode 308. One drawback of this conventional design is that in the OFF-state, there may be a leakage current when the source-drain voltage is high, due to source-drain punch through.

A dielectric layer 312 is located on the top surface of the substrate 302. The dielectric layer 312 is in contact with the substrate 302, the source electrode 304, and the drain electrode 306. The gate electrode 308 disposed on the top of the semiconductor substrate 302 modulates the drain current by a vertical gate field. The dielectric layer 312 is inserted in between the lateral field plate 332 and the channel layer 320. The thickness of the dielectric layer 312 determines the pinch-off voltage in the lateral field plate 332 region 314. The latera field plate 332 alleviates the electric field near the drain electrode 306 end of the gate electrode 308 when the top gate HEMT 300 is biased at a high drain voltage, increasing breakdown voltage and suppressing current collapse when the electric field strength becomes the largest during high voltage operation. The alleviated electric field region 314 near the lateral field plate 332 prevents current collapse and enhances the power performance of the top gate HEMT 300 when it is biased at high drain voltages.

Figure 4:
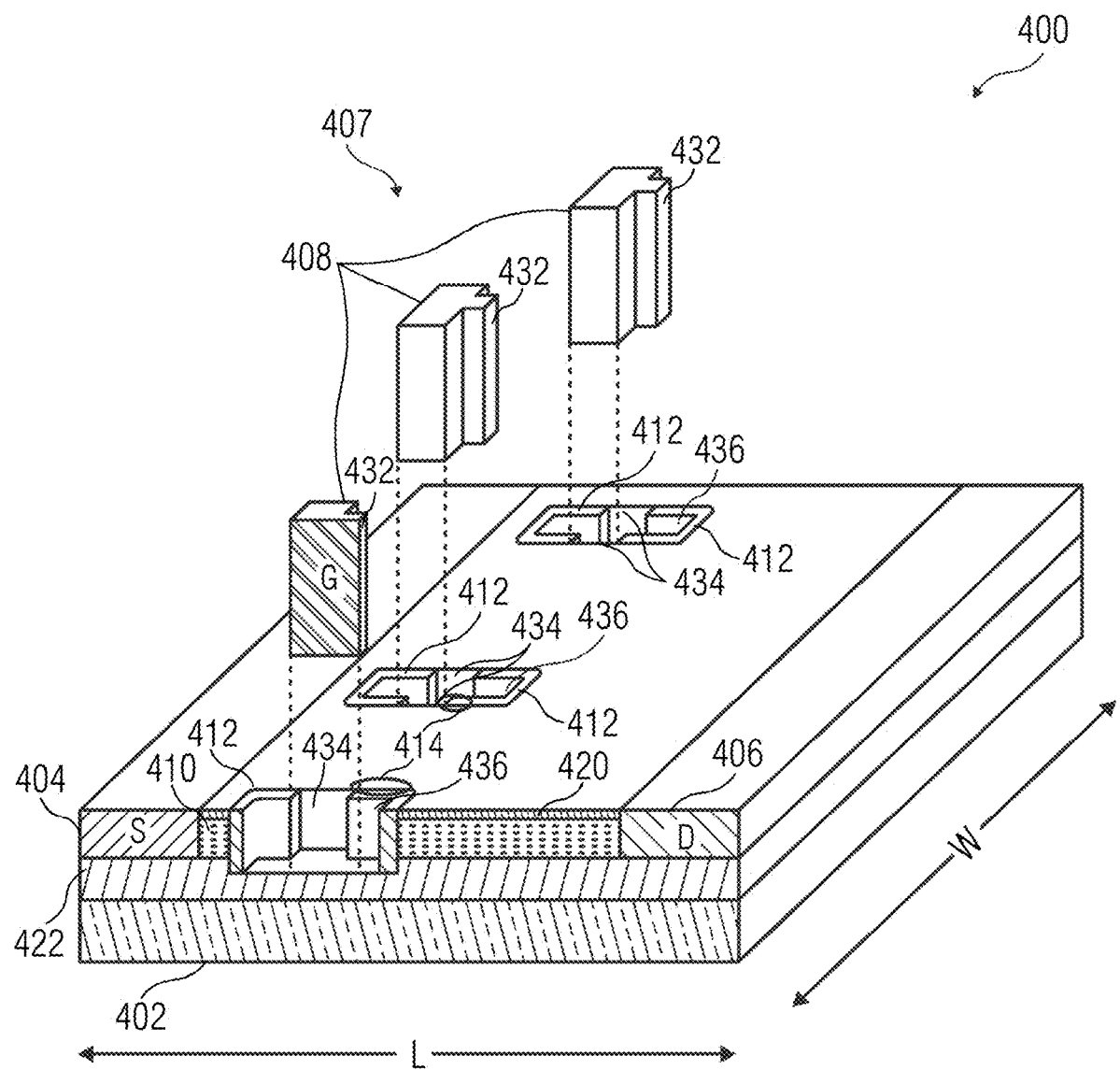
FIG. 4 is a perspective sectional view of a buried gate HEMT with a gate electrode structure comprising a gate electrode and a single lateral field plate arranged in an asymmetric configuration according to at least one aspect of the present disclosure.
Figure 5:
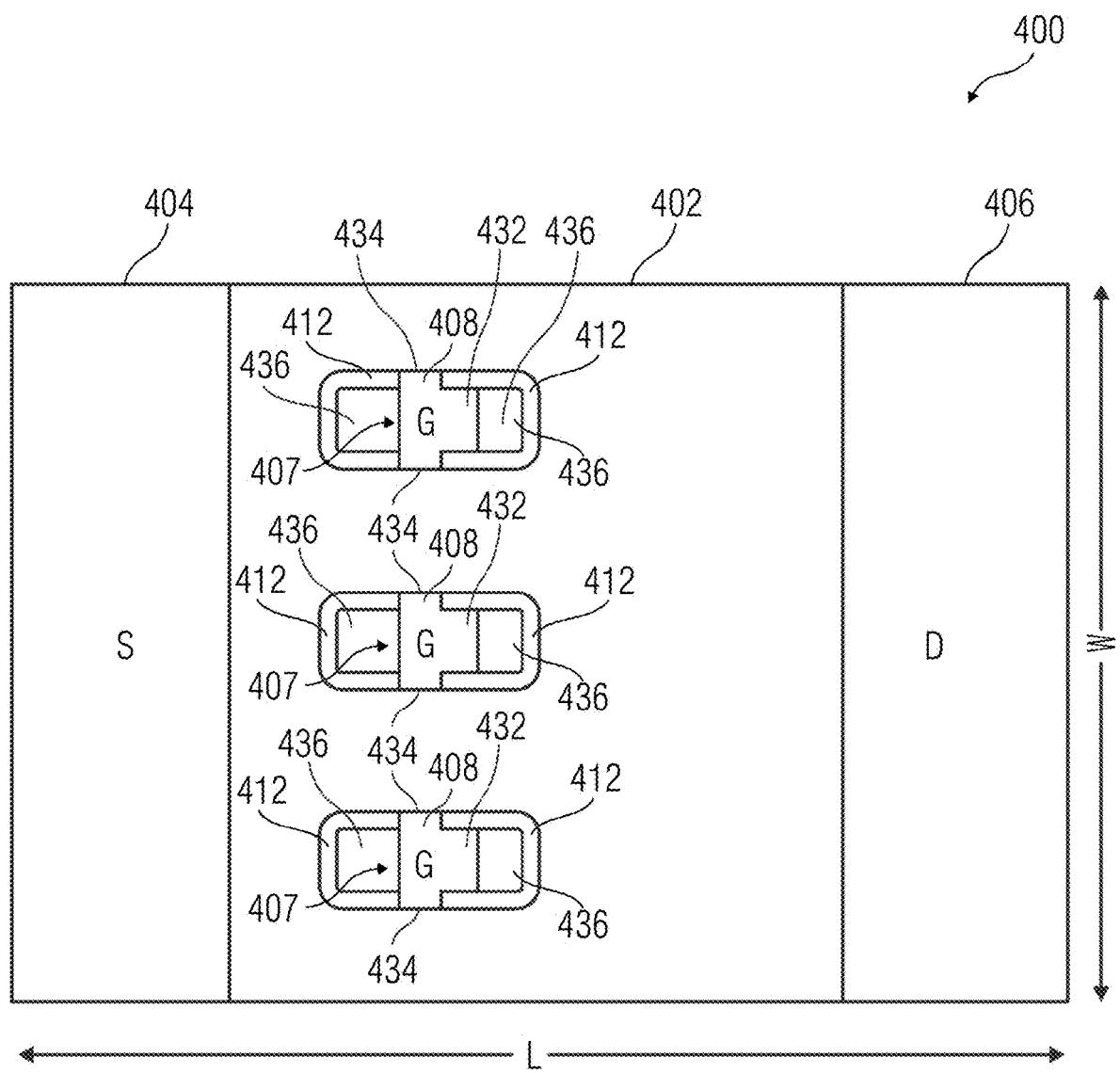
FIG. 5 is a top view of the buried gate HEMT with a gate electrode structure comprising a gate electrode and a single lateral field plate arranged in an asymmetric configuration as shown in FIG. 4 according to at least one aspect of the present disclosure.

FIG. 4 is a perspective sectional view of a buried gate HEMT 400 with a gate electrode structure 407 comprising a gate electrode 408 and a single lateral field plate 432 arranged in an asymmetric configuration and FIG. 5 is a top view of the buried gate HEMT 400 shown in FIG. 4 according to at least one aspect of the present disclosure. In the example illustrated in FIGS. 4 and 5, the FET is a buried gate HEMT in which the drain current is carried via a 2 DEG plane within a channel 410. As shown, the channel 410 comprises multiple conducting channels. The buried gate HEMT 400 comprises a substrate 402, an epitaxial buffer layer 422, a 2 DEG plane within an epitaxial channel 410, an epitaxial top barrier layer 420, and source and drain electrodes 404, 406 on a top surface of the substrate 402. A gate electrode structure 407 on the surface of the substrate 402 comprises a plurality of buried gate electrodes 408 and lateral field plates 432, the tops of which extend above the top surface of the substrate 402 and the bottoms of which are buried in an aperture 436 disposed in the substrate 402 to a depth at least equal to that of the bottom of 2 DEG plane of the channel 410 between a dielectric layer 412 disposed on the sidewalls of the channel 410. The buried gate electrode structures 407 also includes a head portion above (not shown) and not in contact with the top surface of the substrate, which contacts and interconnects all of the buried gate electrodes 408. Thus, the buried gate electrodes 408 contact the 2 DEG plane of the channel 410 only from the sides. When so arranged, the drain current of the FET is controlled by channel width modulation by lateral gating of the 2 DEG plane of the channel 410 by the buried gate electrodes 408. The drain current in the ON-state is controlled by channel width modulation, and the device exhibits excellent electrostatic isolation in the OFF-state because the buried gate electrodes 408 laterally extend the depletion region under the 2 DEG plane of the channel 410. In the illustrated example, the gate electrode structures 407 are located asymmetrically closer to the source electrode 404 end of the substrate 402. A plurality of channels 410 are defined between the source electrode 404 and the drain electrode 406 between the gate electrode structures 407.

In the example depicted in FIGS. 4 and 5, the gate electrodes 408 and lateral field plates 432 are rectangularly shaped and arranged in an asymmetric configuration. The buried gate electrodes 408 and the lateral field plates 432 are not limited to the shape in the depicted example. Each gate electrode structure 407 comprises a gate electrode 408 and a lateral field plate 432 extending longitudinally from the gate electrode 408 towards to the drain electrode 406 end along the length (L) of the substrate 402. The amount of longitudinal extension along the length (L) of the lateral field plate 432 is non-limiting and may be selected for a given application. A dielectric layer 412 is disposed on the inner sidewalls of the aperture 436 where the bottoms of the gate electrodes 408 are buried in the substrate 402. The lateral sides of the bottom of the gate electrodes 408 are received in the apertures 436 through gaps 434 defined in the dielectric layer 412 disposed along the elongated sides of the apertures 436. The dielectric layer 412 surrounds the sidewalls of the apertures 436 containing the gate electrode structures 407 except where the gaps 434 are defined. The buried gate electrodes 408 contact laterally with the channel(s) 410 along the width (W) and modulate the channel widths laterally with gate voltage bias. The lateral field plate 432 is located adjacent to the transistor's gate electrode 408 with a dielectric layer 412 in between the lateral field plate 432 and the channel(s) 410.

The lateral field plate 432 is adjacent to at least one of the plurality of gate electrodes 408 buried in the substrate 402. The lateral field plate 432 is in contact with the drain electrode 406 end of the gate electrode 408 along an edge and is in contact with the dielectric 412 sidewall in the lateral width (W) direction. The lateral field plate 432 is configured to modulate an electric field in the field plate region 414 proximal to the gate electrode 408 proximal to the drain electrode 406 end of at least one of the plurality of gate electrode structures 407 buried in the substrate 402. Throughout this description, the term "lateral" is defined as the direction along the width (W) of the substrate 402 and "longitudinal" is defined as the direction along the length (L) of the substrate 402.

A plurality of channels 410 are located between the source electrode 404 and the drain electrode 406 between the gate electrode structures 407. The lateral field plate 432 creates an alleviated electric field in the lateral field plate region 414. The lateral field plate 432 is in electrical contact with a lateral portion of the plurality of channels 410 through the gate dielectric layer 412. The alleviated electric field in the lateral field plate region 414 is near the drain electrode 406 end of the gate electrode structure 407 and occurs when the device is biased at a high enough drain voltage, increasing breakdown voltage and suppressing current collapse. An alleviated electric field in the lateral field plate region 414 is smaller than an electric field produced without a lateral field plate.

Electrons flow between the buried gate electrode structures 407, with the width of the channels (Wch), measured between the buried gate electrode structures 407 along the width (W) of the substrate 402, controlled by the depletion induced by the lateral sides of the bottom of the buried gate electrode structures 407, and by the pitch ("Pg-g") between adjacent buried gate electrode structures 407. The preferably nanometer-scale parallel channels reduce self-heating during large signal operation by spatially distributing the heat sources. The width (W) is transverse to the length (L) of the substrate 402. The buried gate electrodes 408 contact laterally with the channel(s) defined between the gate electrode structures 407 along the width (W) and modulate the channel widths Wch laterally with the gate bias.

The channel 410 of the buried gate HEMT 400 illustrated in FIG. 4, comprises a 2 DEG plane. For this type of FET, the bottoms of buried gate electrode structures 407 should be buried at least to the bottom of the 2 DEG plane of the channel 410. As the 2 DEG plane occupies only the upper portion of the channel layer, the bottoms of the buried gate electrode structures 407 can be within the channel 410, or even in the buffer layer 422.

The depth to which the buried gate electrode structures 407 should be buried depends on the device type. The bottoms of the buried gate electrode structures 407 should be buried to a depth at least equal to the bottom of the current-carrying 2 DEG plane in the channel 410. If the device is a MESFET, the buried gate electrode structures 407 could be buried to a depth at least equal to the bottom of the channel 410. In general, the buried gate electrode structures 407 must be buried deep enough so that they contact the current-carrying portion of the channel 410 only from its sides, such that the drain current of the FET is controlled by channel width modulation by lateral gating of the current-carrying layer by the buried gate electrode structures 407.

An FET employing buried gate electrode structures 407 as described herein controls drain current via channel width modulation, by laterally gating the channel 410. The laterally extended depletion region under the channel 410 enhances electrostatic isolation, and reduces leakage current and drain-induced barrier lowering (DIBL) in the off-state; it also reduces output conductance in on-state, thereby improving transistor gain. Effective source and drain resistances are very small (~⅓ those of planar HEMTs) because the source and drain contact width is wider than the effective channel width, thereby reducing the knee voltage. In addition, having no contact between the top of substrate 402 and the head portion (not shown) suppresses the electron trapping effect during large signal operation, and eliminates the inverse piezoelectric effect.

The buried gate electrode structures 407 can have any of a number of shapes. For example, the structures may be cylindrical. They might also be, for example, rectangular, or any other suitable shape.

As shown in FIG. 4, the plurality of buried gate electrode structures 407 may lie along a line which is parallel to and between the source and drain electrodes 404, 406, though this is not essential. In this example, the buried gate electrode structures 407 are evenly spaced along said line (i.e., the buried gates have a fixed pitch). As FET characteristics such as threshold voltage vary with pitch, the fixed pitch can be selected as needed to achieve desired performance characteristics.

The dielectric layer 412 is in contact with the sidewalls of the channel 410 where the bottoms of the buried gate electrode structures 407 are buried in the substrate 402 down into the channel 410. The dielectric layer 412 also is in contact with the top surface of the substrate 402. The buried gate electrode structures 407 modulate the drain current by a vertical gate field. This forms a lateral field plate region 414 at the drain electrode 406 end of the buried gate electrode structures 407 where an electric field strength is alleviated during high voltage operation. Alleviation of the high electric field strength in this lateral field plate region 414 prevents current collapse by electron trapping at the semiconductor surface and enhances the power performance of the buried gate HEMT 400 when it is biased at high drain voltages.

To alleviate the high electric field strength in regions 414, the lateral field plates 432 are integrated with the gate electrode structures 407 and a dielectric layer 412 is inserted in between the lateral field plates 432 and the channel 410. The thickness of the dielectric layer 412 determines the pinch-off voltage in the lateral field plate region 414. The lateral field plates 432 alleviate the electric field in the regions 414 near the drain electrode 406 end of the gate electrode structures 407 when the buried gate HEMT 400 is biased at a high drain voltage, increasing breakdown voltage and suppressing current collapse.

Laterally-gated transistors with multiple channels 410, as shown in FIGS. 4 and 5, for example, increase the power density and current handling of the transistor to decrease the on-resistance of the transistor for both RF and power switching applications. In the laterally-gated transistors, the field lateral field plates 432 contacts laterally with the channel(s) 410 through a gate dielectric layer 412 made of SiN, SiO2, SiON, AlN, Al2O3, AlON, HfO2, HfN, or HfON, for example. The thickness of the gate dielectric layer 412 deposited on the sidewalls is made to be the same in the depth direction, enabling the distance between the lateral field plates 432 and the channel 410 to be the same for multiple channels.

Figure 6:
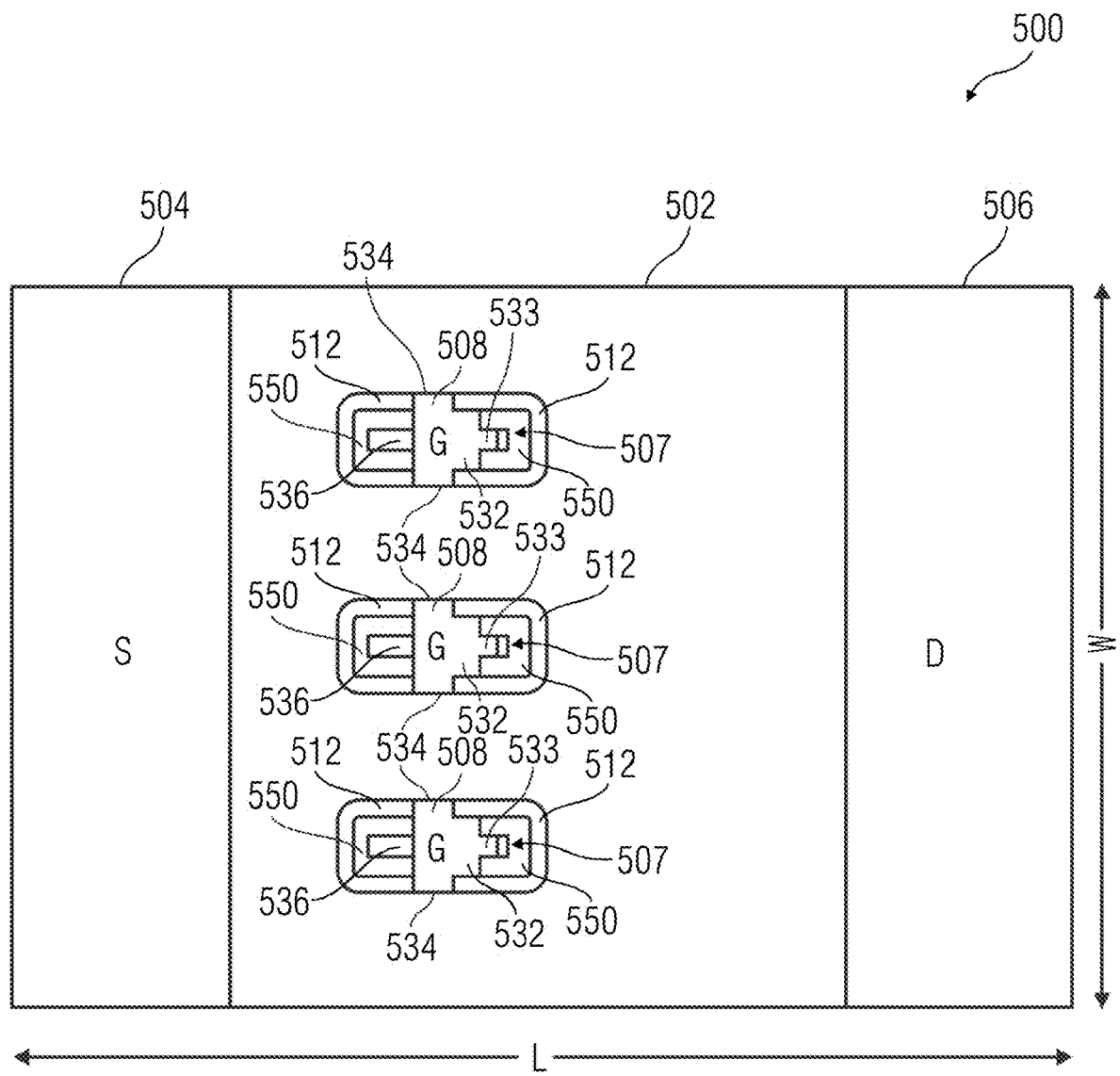
FIG. 6 is a top view of a buried gate HEMT with a gate electrode structure comprising a gate electrode and double lateral field plates arranged in an asymmetric configuration according to at least one aspect of the present disclosure.

FIG. 6 is a top view of a buried gate HEMT 500 with a gate electrode structure 507 comprising a gate electrode 508 and double lateral field plates 532, 533 arranged in an asymmetric configuration according to at least one aspect of the present disclosure. The buried gate HEMT 500 comprises a substrate 502, a source electrode 504, and a drain electrode 506. The source electrode 504 and the drain electrode 506 are located on a top surface of the substrate 502. The substrate 502 comprises a plurality of gate electrode structures 507 buried in apertures 536 disposed in the substrate 502 analogous to the apertures 236, 436 shown in FIGS. 2 and 4, for example, disposed in the substrates 202, 402 and extending into the channels 210, 410. In the illustrated example, the gate electrode structures 507 are located asymmetrically closer to the source electrode 504 end of the substrate 502. A plurality of channels extending along the length (L) of the substrate 502 between the source and drain electrodes 504, 506 are disposed between the gate electrode structures 507.

In the example depicted in FIG. 6, the buried gate electrodes 508 and first and second lateral field plates 532, 533 are rectangularly shaped and arranged in an asymmetric configuration. The buried gate electrodes 508 and the first and second lateral field plates 532, 533 are not limited to the shape in the depicted example. The first and second lateral field plates 532, 533 extend longitudinally from the gate electrodes 508 towards the drain electrode 506 along the length (L) of the substrate 502. The first and second lateral field plates 532, 533 extend laterally along the width (W) direction of the substrate 502.

A first dielectric layer 512 is disposed on the inner sidewalls of the apertures 536 where the bottoms of the gate electrode structures 507 are buried in the substrate 502 down into the channel(s). A second dielectric layer 550 is disposed over the sidewalls of the first dielectric layers 512. The lateral sides of the bottoms of the gate electrodes 508 are received within the apertures 536 through gaps 534 defined in the dielectric layers 512, 550 along the longitudinal sides of the apertures 536. The dielectric layers 512, 550 surround the sidewalls of the apertures 536 containing the gate electrodes 508 except where the gaps 534 are defined in the apertures 536.

The buried gate electrodes 508 contact laterally with the channel(s) in the width (W) direction of the substrate 502 and modulate the widths of the channel(s) in the width (W) direction with gate voltage bias. The first lateral field plate 532 is located adjacent to the transistor's gate electrode 508 and the second lateral field plate 533 is located adjacent to the first lateral field plate 532 and extends longitudinally towards the drain electrode 506 along the length (L) direction of the substrate 502. The first dielectric layer 512 is disposed on the sidewalls of the apertures 536 and the second dielectric layer 550 is disposed on the inner sidewalls of the first dielectric layer 512.

To alleviate the high electric field strength in regions proximal to the drain electrode 506, two lateral field plates 532, 533 are integrated with each of the gate electrode 508. The first dielectric layer 512 is inserted in between the first lateral field plate 532 and the channel and the first and second dielectric layers 512, 550 are inserted in between the second lateral field plate 533 and the channel. For at least one of the gate electrode structures 507, the first lateral field plate 532 laterally contacts the first dielectric layer 512 and longitudinally contacts the second dielectric layer 550. The second lateral field plate 533 laterally contacts the second dielectric layer 550. The first and second lateral field plates 532, 533 are configured to modulate an electric field proximal to a field plate region proximal to the gate electrode 508 proximal to the drain electrode 506 end of at least one of the plurality of gate electrode structures 507 buried in the substrate 502. The thickness of the dielectric layers 512, 550 determine the pinch-off voltage in the lateral field plate region. The lateral field plates 532, 533 alleviate the electric field in the lateral field plate regions near the drain electrode 506 end of the gate electrodes 508 when the buried gate HEMT 500 is biased at a high drain voltage, increasing breakdown voltage and suppressing current collapse.

Figure 7:
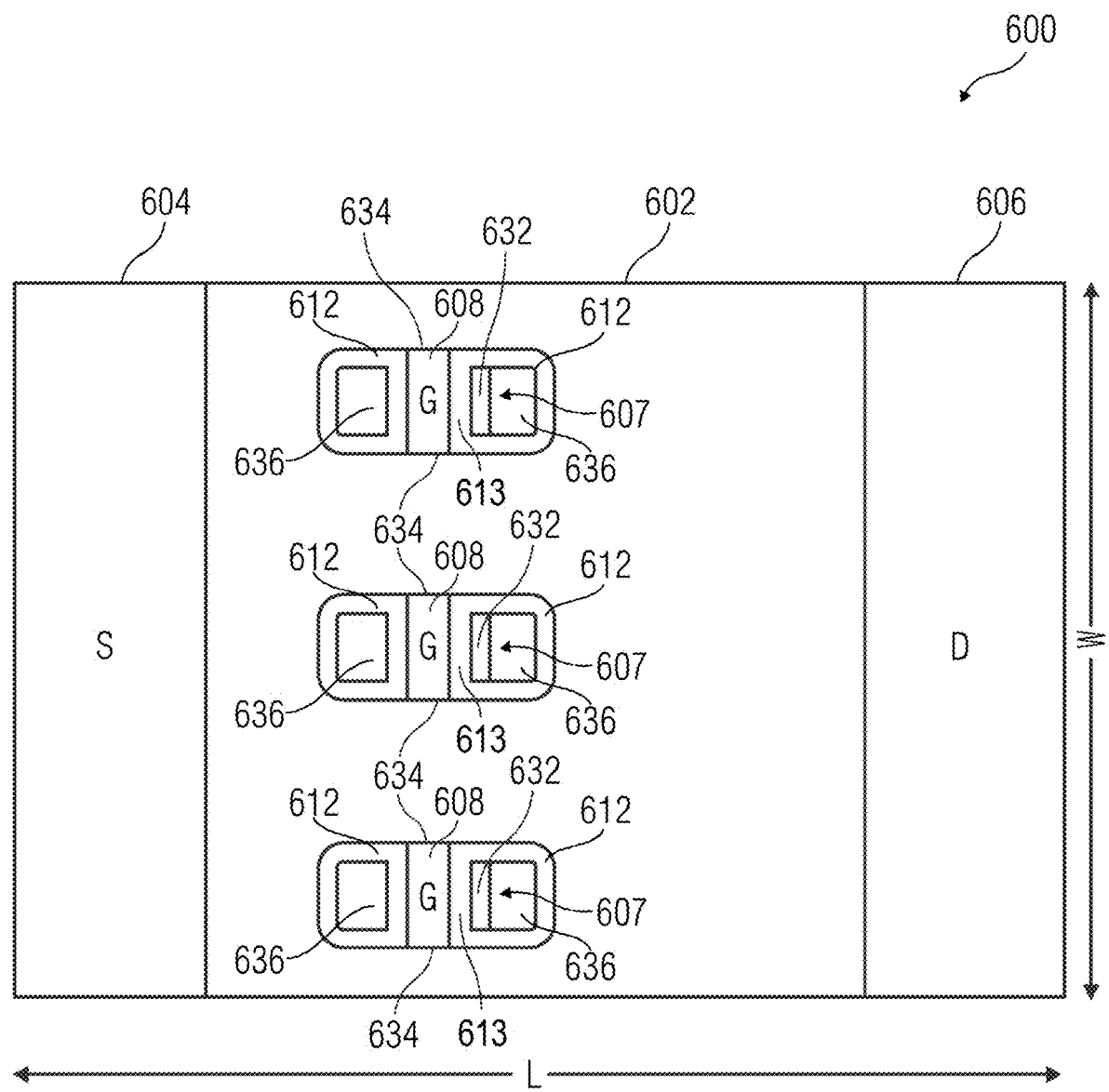
FIG. 7 is a top view of a buried gate HEMT with a gate electrode structure comprising a gate electrode and a single lateral field plate arranged in an asymmetric configuration according to at least one aspect of the present disclosure.

FIG. 7 is a top view of a buried gate HEMT 600 with a gate electrode structure 607 comprising a gate electrode 608 and a single lateral field plate 632 arranged in an asymmetric configuration according to at least one aspect of the present disclosure. The buried gate HEMT 600 comprises a substrate 602, a source electrode 604, and a drain electrode 606. The source electrode 604 and the drain electrode 606 are located on the top surface of the substrate 602. The substrate 602 comprises a plurality of gate electrode structures 607 buried in apertures 636 disposed in the substrate 602 analogous to the apertures 236, 436 shown in FIGS. 2 and 4, for example, disposed in the substrates 202, 402 and extending into the channels 210, 410. In the illustrated example, the gate electrode structures 607 are located asymmetrically closer to the source electrode 604 end of the substrate 602. A plurality of channels extending along the length (L) of the substrate 602 between the source and drain electrodes 604, 606 are disposed between the gate electrode structures 607.

In the example depicted in FIG. 7, the buried gate electrodes 608 and the single lateral field plate 632 are rectangularly shaped and arranged in an asymmetric configuration. The buried gate electrodes 608 and the single lateral field plates 632 are not limited to the shape in the depicted example. The single lateral field plate 632 extends longitudinally from the gate electrode 608 towards the drain electrode 606 along the length (L) of the substrate 602. The single lateral field plate 632 extends laterally along the width (W) direction of the substrate 602.

A dielectric layer 612 is disposed on the inner sidewalls of the apertures 636 where the bottoms of the gate electrode structures 607 are buried in the substrate 602 down into the channel(s). The lateral sides of the bottoms of the gate electrodes 608 are received within the apertures 636 through gaps 634 defined in the dielectric layer 612 along the longitudinal sides of the apertures 636. The dielectric layer 612 surrounds the sidewalls of the apertures 636 including sidewall portions of the gate electrodes 608 in the lateral direction along the width (W) of the substrate 602 except where the gaps 634 are defined in the apertures 636.

The buried gate electrodes 608 contact laterally with the channel(s) in the width (W) direction of the substrate 602 and modulate the channel widths along the width (W) direction with gate voltage bias. The single lateral field plate 632 is located adjacent to the transistor's gate electrode 608 and extends longitudinally towards the drain electrode 606 along the length (L) direction of the substrate 602. The dielectric layer 612 is disposed on the sidewalls of the apertures 636 and along the sidewalls of the gate electrode 608 in a lateral direction along the width (W) of the substrate 602. The single lateral field plate 632 is separated from the gate electrode 608 by a portion 613 of the dielectric layer 612.

To alleviate the high electric field strength in regions proximal to the drain electrode 606, a single lateral field plate 632 is integrated with each the gate electrode 608 and the dielectric layer 612 is inserted in between the single lateral field plate 632 and the channel. For at least one of the gate electrode structures 607, the lateral field plate 632 laterally contacts the dielectric layer 612 and longitudinally contacts the portion 613 of the dielectric layer 612 between the gate electrode 608 and the lateral field plate 632. The single lateral field plate 632 is configured to modulate an electric field proximal to a field plate region proximal to the gate electrode 608 proximal to the drain electrode 606 end of at least one of the plurality of gate electrode structures 607 buried in the substrate 602. The thickness of the dielectric layer 612 determines the pinch-off voltage in the lateral field plate region. The single lateral field plate 632 alleviate the electric field in the lateral field plate regions near the drain electrode 606 end of the gate electrodes 608 when the buried gate HEMT 600 is biased at a high drain voltage, increasing breakdown voltage and suppressing current collapse.

Figure 8:
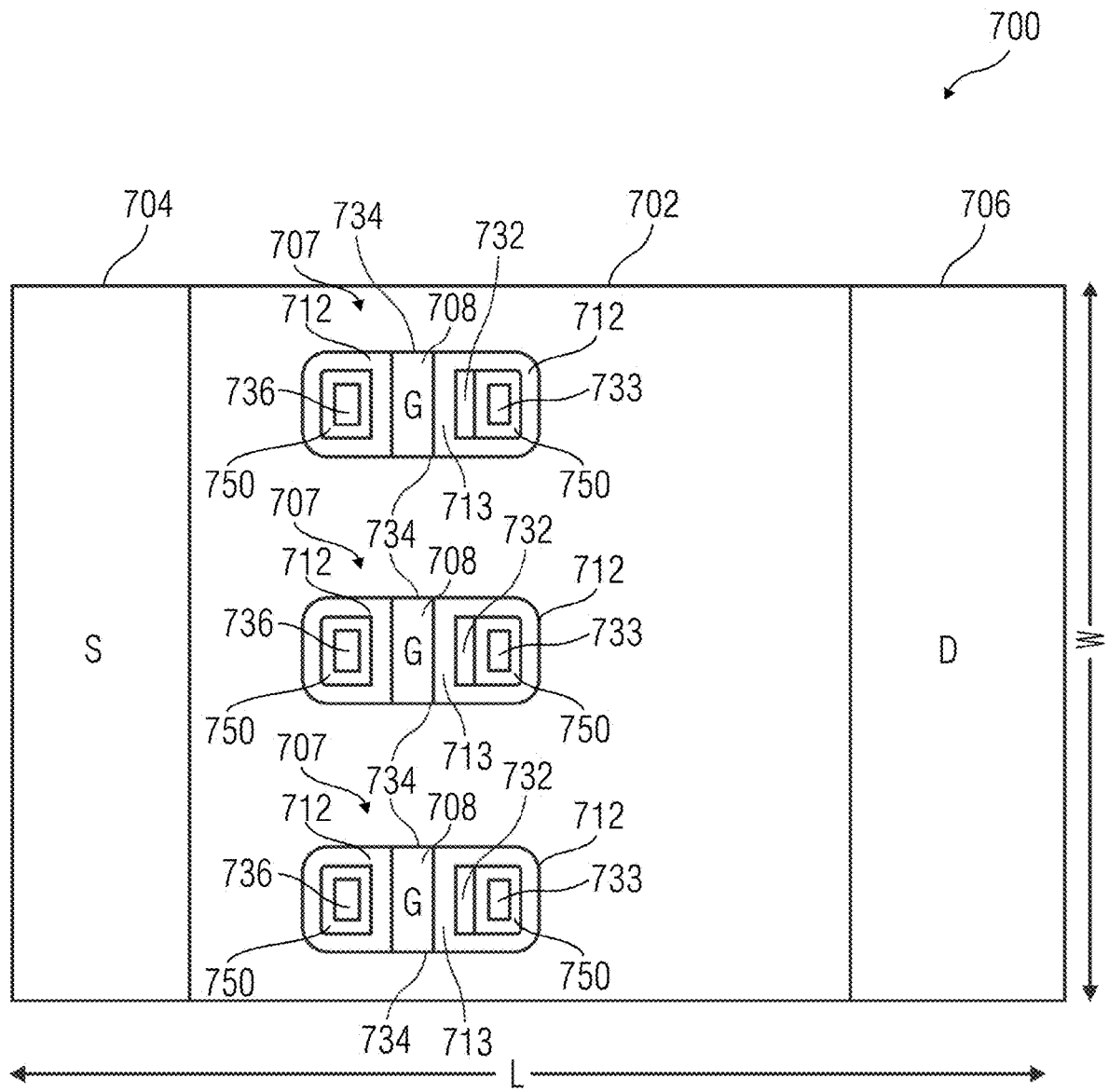
FIG. 8 is a top view of a buried gate HEMT with a gate electrode structure comprising a gate electrode and a double lateral field plate arranged in an asymmetric configuration according to at least one aspect of the present disclosure.

FIG. 8 is a top view of a buried gate HEMT 700 with a gate electrode structure 707 comprising a gate electrode 708 and a double lateral field plate 732, 733 arranged in an asymmetric configuration according to at least one aspect of the present disclosure. The buried gate HEMT 700 comprises a substrate 702, a source electrode 704, and a drain electrode 706. The source electrode 704 and the drain electrode 706 are located on the top surface of the substrate 702. The substrate 702 comprises a plurality of gate electrode structures 707 buried in apertures 736 disposed in the substrate 702 analogous to the apertures 236, 436 shown in FIGS. 2 and 4, for example, disposed in the substrates 202, 402 and extending into the channels 210, 410. In the illustrated example, the gate electrode structures 707 are located asymmetrically closer to the source electrode 704 end of the substrate 702. A plurality of channels extending along the length (L) of the substrate 702 between the source and drain electrodes 704, 706 are disposed between the gate electrode structures 707.

In the example depicted in FIG. 8, the buried gate electrode 708 and the first and second lateral field plates 732, 733 are rectangularly shaped and arranged in an asymmetric configuration. The buried gate electrodes 708 and the first and second lateral field plates 732, 733 are not limited to the shape in the depicted example. The first and second lateral field plates 732, 733 extend longitudinally from the gate electrode 708 towards the drain electrode 706 end along the length (L) of the substrate 702. The first and second lateral field plates 732, 733 extend laterally along the width (W) of the substrate 702.

A first dielectric layer 712 is disposed on the inner sidewalls of the apertures 736 where the bottoms of the gate electrode structures 707 are buried in the substrate 702 down into the channel(s). A second dielectric layer 750 is disposed on the inner sidewalls of the first dielectric layers 712. The lateral sides of the bottoms of the gate electrodes 708 are received within the apertures 736 through gaps 734 defined in the first dielectric layers 712 along the longitudinal sides of the apertures 736. The first dielectric layers 712 surround the sidewalls of the apertures 736 including the sides of the gate electrodes 708 along the width (W) direction except where the gaps 734 are defined. The second dielectric layers 750 proximal to the source electrode 704 side of the substrate 702 surround the sidewalls of the first dielectric layers 712. The second dielectric layers 750 proximal to the drain electrode 706 side of the substrate 702 are disposed along the sidewalls of the apertures 736, about the sidewalls of the second lateral field plate 733, and in between the sidewalls of the first and second lateral field plates 732, 733.

The buried gate electrodes 708 contact laterally with the channel(s) in the width (W) direction of the substrate 702 and modulate the widths of the channel(s) in the width (W) direction with gate bias voltage. The first lateral field plate 732 is located adjacent to the transistor's gate electrode 708 and separated by a portion 713 of the first dielectric layer 712 proximal to the drain electrode 706. The first lateral field plate 732 contacts the first dielectric layer 712 on three sides and contacts the second dielectric layer 750 on the side proximal to the drain electrode 706. The second lateral field plate 733 is located adjacent to the first lateral field gate 732 is disposed longitudinally from the first lateral field plate 732 toward the drain electrode 706 and contacts the second dielectric layer 750 on all four sides. The second lateral field plate 733 does not contact the first dielectric layer 712.

To alleviate the high electric field strength in regions proximal to the drain electrode 706, two lateral field plates 732, 733 are integrated with each of the gate electrodes 708. The first dielectric layer 712 is inserted between the first lateral field plate 732 and the cannel(s) and the second dielectric layer 750 is inserted between the second lateral field plate 733 and the first dielectric layer 712 and between the first and second lateral field plates 732, 733. For at least one of the gate electrode structures 707, the first later field plate 732 laterally contacts the first dielectric layer 712 and the second lateral field plate 733 laterally contacts the second dielectric layer 750. The first and second lateral field plates 732, 733 are configured to modulate an electric field proximal to a field plate region proximal to the gate electrode 708 proximal to the drain electrode 706 end of at least one of the plurality of gate electrode structures 707 buried in the substrate 702. The thickness of the dielectric layers 712, 750 determine the pinch-off voltage in the lateral field plate region. The lateral field plates 732, 733 alleviate the electric field in the lateral field plate regions near the drain electrode 706 end of the gate electrodes 708 when the buried gate HEMT 700 is biased at a high drain voltage, increasing breakdown voltage and suppressing current collapse.

Figure 9:
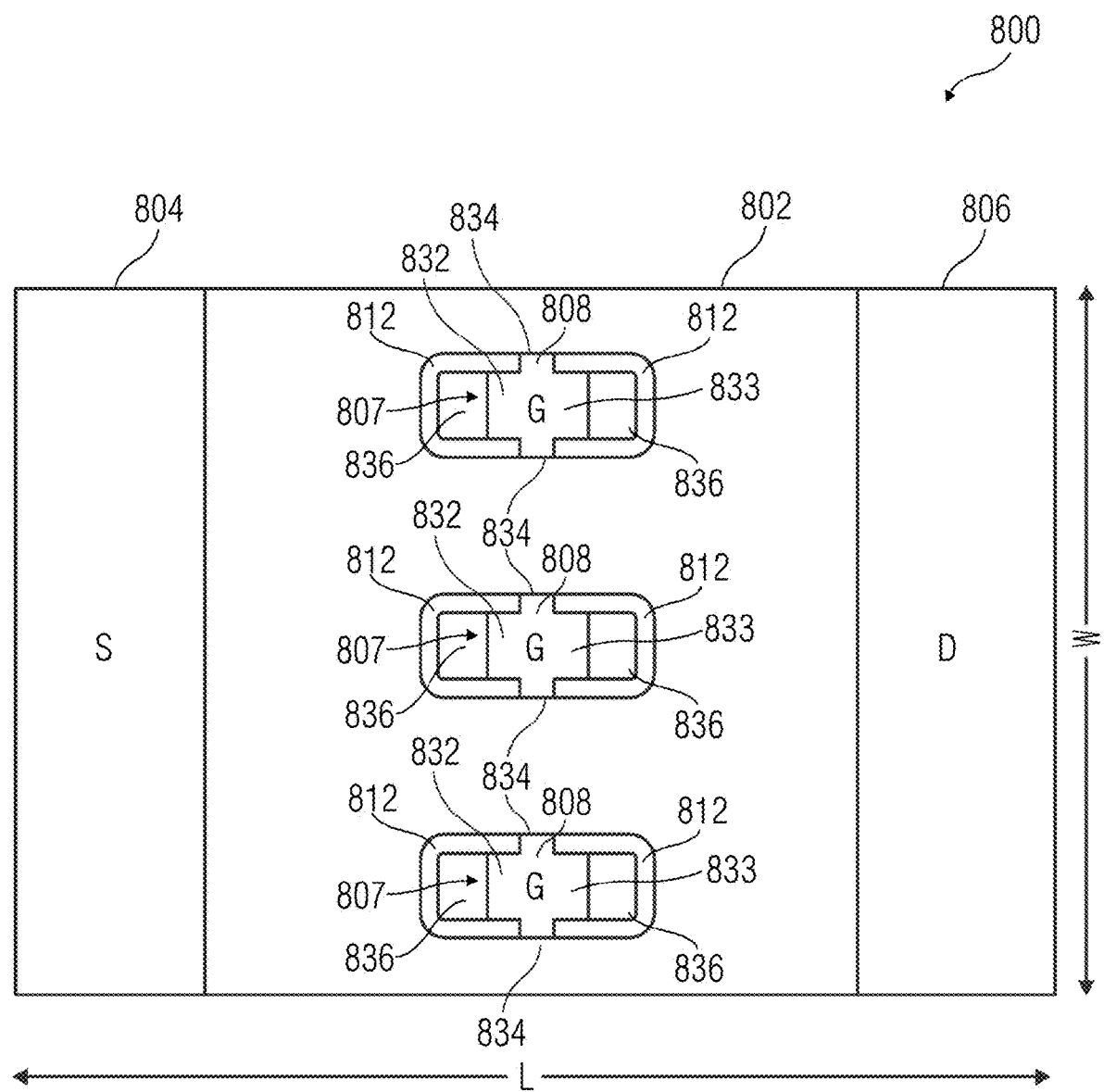
FIG. 9 is a top view of a buried gate HEMT with a gate electrode structure comprising a gate electrode and a lateral field plate arranged in a symmetric configuration according to at least one aspect of the present disclosure.

FIG. 9 is a top view of a buried gate HEMT 800 with a gate electrode structure 807 comprising a gate electrode 808 and lateral field plates 832, 833 arranged in a symmetric configuration according to at least one aspect of the present disclosure. The buried gate HEMT 800 comprises a substrate 802, a source electrode 804, and a drain electrode 806. The source electrode 804 and the drain electrode 806 are located on a top surface of the substrate 802. The substrate 802 comprises a plurality of gate electrode structures 807 buried in apertures 836 disposed in the substrate 802 analogous to the apertures 236, 436 shown in FIGS. 2 and 4, for example, disposed in the substrates 202, 402 and extending into the channels 210, 410. In the illustrated example, the gate electrode structures 807 are located symmetrically between the source and drain electrodes 804, 806. A plurality of channels extending along the length (L) of the substrate 802 between the source and drain electrodes 804, 806 are disposed between the gate electrode structures 807.

In the example depicted in FIG. 9, the buried gate electrodes 808 and the first and second lateral field plates 832, 833 are rectangularly shaped and arranged in a symmetric configuration. The buried gate electrodes 808 and the first and second lateral field plates 832, 833 are not limited to the shape in the depicted example. The first lateral field plate 832 extends longitudinally from the gate electrode 808 towards the source electrode 804 along the length (L) of the substrate 802 and the second lateral field plate 833 extends longitudinally from the gate electrode 808 towards the drain electrode 806 along the length (L) of the substrate 802. The first and second lateral field plates 832, 833 extend laterally along the width (W) direction of the substrate 802.

A dielectric layer 812 is disposed on the inner sidewalls of the apertures 836 where the bottoms of the gate electrode structures 807 are buried in the substrate 802 down into the channel(s). The lateral sides of the bottoms of the gate electrodes 808 are received within the apertures 836 through gaps 834 defined in the dielectric layers 812 along the longitudinal sides of the apertures 836. The dielectric layers 812 surround the sidewalls of the apertures 836 containing the gate electrodes 808 except where the gaps 834 are defined in the apertures 836.

The buried gate electrodes 808 contact laterally with the channel(s) in the width (W) direction of the substrate 802 and modulate the widths of the channel(s) in the width (W) direction with gate voltage bias. The first lateral field plate 832 is located adjacent to the transistor's gate electrode 808 proximal to the source electrode 804 and extends longitudinally towards the source electrode 804 along the length (L) direction of the substrate 802, The second lateral field plate 833 is located adjacent to the gate electrode 808 proximal to the drain electrode 806 and extends longitudinally towards the drain electrode 806 along the length (L) direction of the substrate 802. The dielectric layer 812 is disposed on the sidewalls of the apertures 836.

To alleviate the high electric field strength in regions proximal to the source and drain electrodes 804, 806, two lateral field plates 832, 833 are integrated symmetrically with each of the gate electrodes 808. The dielectric layer 812 is inserted in between the first lateral field plate 832 and the channel. For at least one of the gate electrode structures 807, the first and second lateral field plates 832, 833 laterally contact the dielectric layer 812. The first and second lateral field plates 832, 833 are configured to modulate an electric field proximal to a field plate region proximal to the gate electrode 808 proximal to the source and drain electrodes 804, 806 end of at least one of the plurality of gate electrode structures 807 buried in the substrate 802. The thickness of the dielectric layer 812 determines the pinch-off voltage in the lateral field plate region. The lateral field plates 832, 833 alleviate the electric field in the lateral field plate regions near the source and drain electrodes 804, 806 end of the gate electrodes 808 when the buried gate HEMT 800 is biased at a high drain voltage, increasing breakdown voltage and suppressing current collapse.

Figure 10:
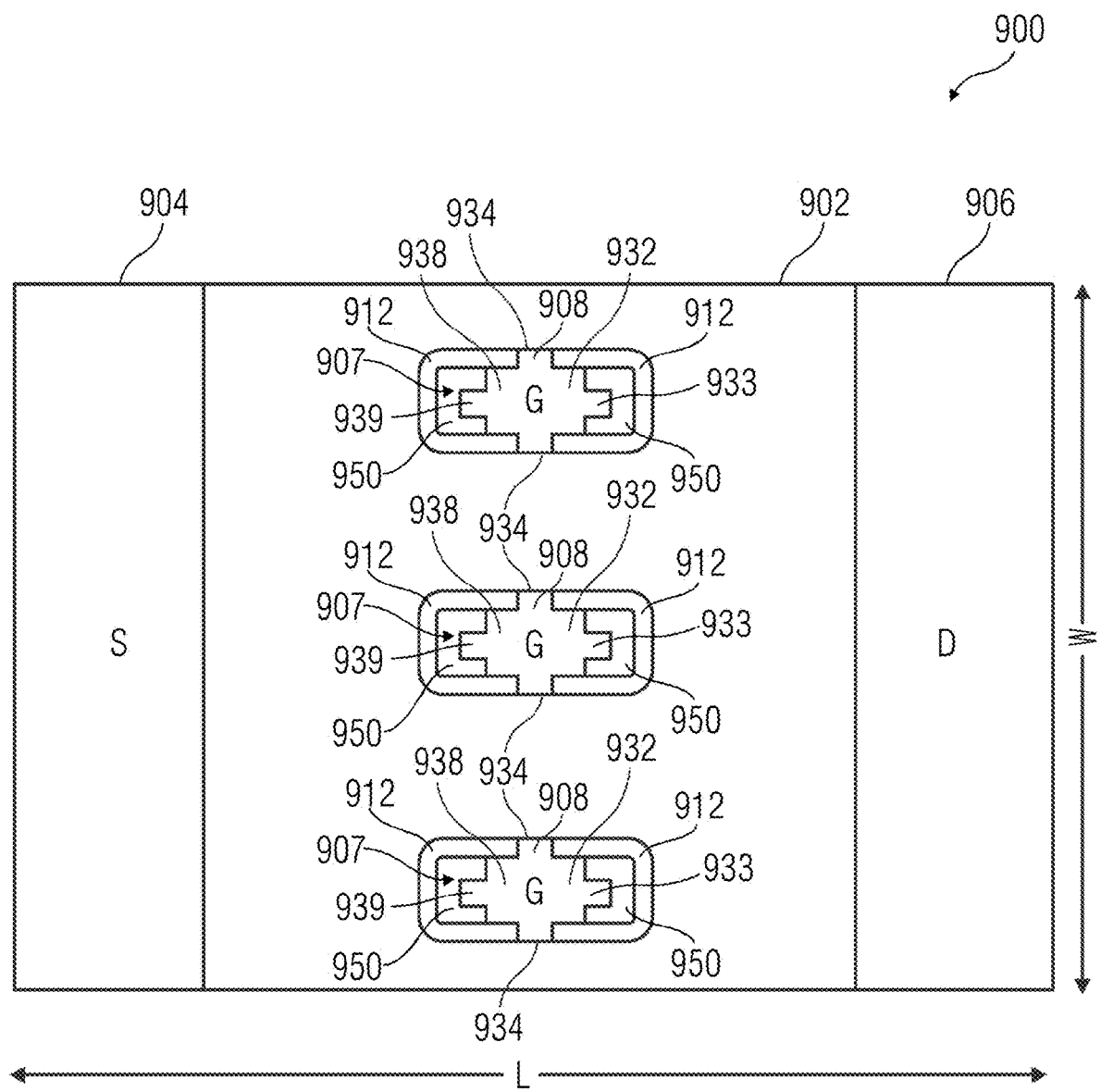
FIG. 10 is a top view of a buried gate HEMT with a gate electrode structure comprising a gate electrode and double lateral field plates arranged in a symmetric configuration according to at least one aspect of the present disclosure.

FIG. 10 is a top view of a buried gate HEMT 900 with a gate electrode structure 907 comprising a gate electrode 908 and double lateral field plates 932, 933 and 938, 939 arranged in a symmetric configuration according to at least one aspect of the present disclosure. The buried gate HEMT 900 comprises a substrate 902, a source electrode 904, and a drain electrode 906. The source electrode 904 and the drain electrode 906 are located on a top surface of the substrate 902. The substrate 902 comprises a plurality of gate electrode structures 907 buried in apertures (not shown) disposed in the substrate 902 analogous to the apertures 236, 436 shown in FIGS. 2 and 4, for example, disposed in the substrates 202, 402 and extending into the channels 210, 410. In the illustrated example, the gate electrode structures 907 are located symmetrically between the source and drain electrodes 904, 906. A plurality of channels extending along the length (L) of the substrate 902 between the source and drain electrodes 904, 906 are disposed between the gate electrode structures 907.

In the example depicted in FIG. 10, the buried gate electrodes 907 and the four lateral field plates 932, 933, 938, 939 are rectangularly shaped and arranged in a symmetric configuration. The buried gate electrodes 908 and the four lateral field plates 932, 933, 938, 939 are not limited to the shape in the depicted example. The first and second lateral field plates 932, 933 extend longitudinally from the gate electrode 908 towards the drain electrode 906 along the length (L) of the substrate 902 and the third and fourth lateral field plates 938, 939 extend longitudinally from the gate electrode 908 towards the source electrode 904 along the length (L) of the substrate 902. The four lateral field plates 932, 933, 938, 939 extend laterally along the width (W) direction of the substrate 902.

A first dielectric layer 912 is disposed on the inner sidewalls of the apertures where the bottoms of the gate electrode structures 907 are buried in the substrate 902 down into the channel(s). The lateral sides of the bottoms of the gate electrodes 908 are received within the apertures through gaps 934 defined in the first dielectric layers 912 along the longitudinal sides of the apertures. The first dielectric layers 912 surround the sidewalls of the apertures containing the gate electrode structures 907 except where the gaps 934 are defined in the apertures. A second dielectric layer 950 is disposed on the inner sidewalls of the first dielectric layer 912.

The buried gate electrodes 908 contact laterally with the channel(s) in the width (W) direction of the substrate 902 and modulate the widths of the channel(s) in the width (W) direction with gate voltage bias. The first lateral field plate 932 is located adjacent to the transistor's gate electrode 908 proximal to the drain electrode 906 and extends longitudinally towards the drain electrode 906 along the length (L) direction of the substrate 902. The second lateral field plate 938 is located adjacent to the first lateral field plate 932 and also extends longitudinally towards the drain electrode 906 along the length (L) direction of the substrate 902. The third lateral field plate 938 is located adjacent to the gate electrode 908 proximal to the source electrode 904 and extends longitudinally towards the source electrode 904 along the length (L) direction of the substrate 902. The fourth lateral field plate 939 is located adjacent to the first lateral field plate 938 and also extends longitudinally towards the source electrode 904 along the length (L) direction of the substrate 902. The dielectric layer 912 is disposed on the sidewalls of the apertures.

To alleviate the high electric field strength in regions proximal to the source and drain electrodes 904, 906, four lateral field plates 932, 933, 938, 939 are integrated symmetrically with each of the gate electrodes 908. The first dielectric layer 912 is inserted in between the first and third lateral field plates 932, 938 and the channel. For at least one of the gate electrode structures 907, the first and third lateral field plates 932, 938 laterally contact the first dielectric layer 912 and longitudinally contact the second dielectric layer 950. The second and fourth lateral field plates 933, 939 laterally and longitudinally contact the second dielectric layer 950. The four lateral field plates 932, 933, 938, 939 are configured to modulate an electric field proximal to a field plate region proximal to the gate electrode 908 proximal to the source and drain electrodes 904, 906 end of at least one of the plurality of gate electrodes 908 buried in the substrate 902. The thickness of the dielectric layers 912, 950 determines the pinch-off voltage in the lateral field plate region. The lateral field plates 932, 933, 938, 939 alleviate the electric field in the lateral field plate regions near the source and drain electrodes 904, 906 end of the gate electrodes 908 when the buried gate HEMT 900 is biased at a high drain voltage, increasing breakdown voltage and suppressing current collapse.

Figure 11:
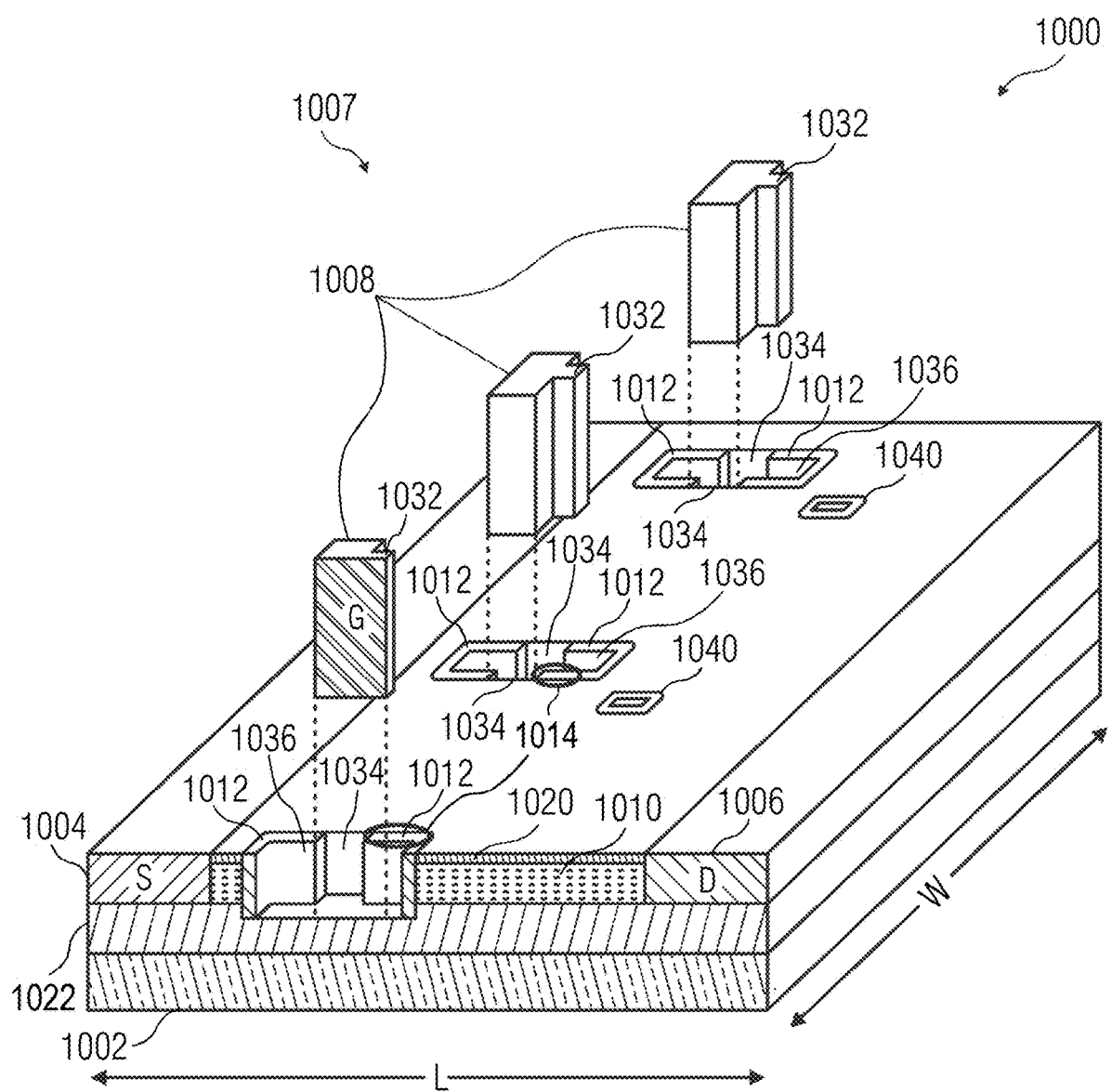
FIG. 11 is a perspective sectional view of a buried gate HEMT with a gate electrode structure comprising a gate electrode and a single lateral field plate and a dielectric structure buried in a substrate remote from the gate electrode structure according to at least one aspect of the present disclosure.
Figure 12:
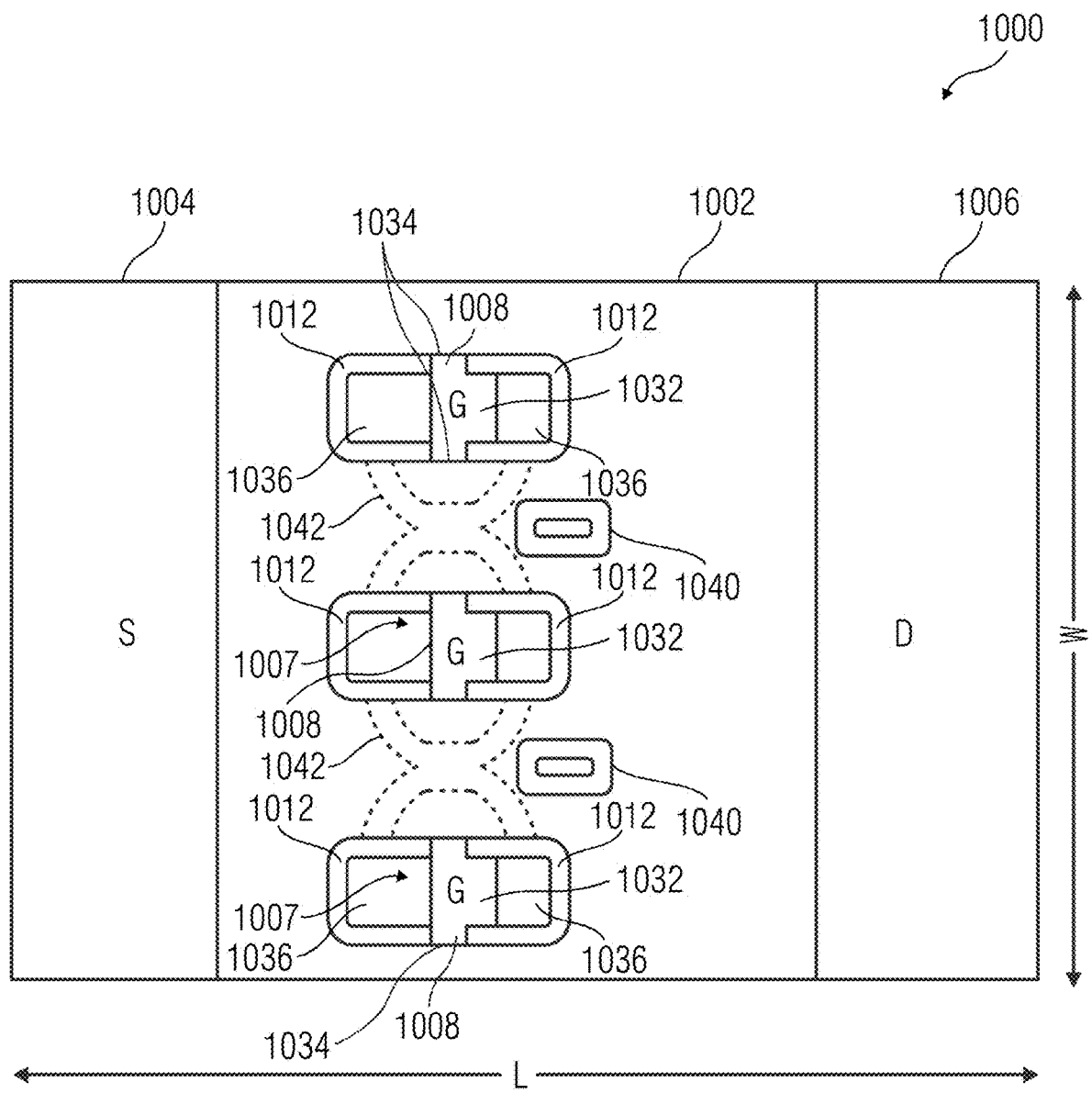
FIG. 12 is a top view of the buried gate HEMT shown in FIG. 11 according to at least one aspect of the present disclosure.

FIG. 11 is a perspective view of a buried gate HEMT 1000 with a gate electrode structure 1007 comprising a gate electrode 1008 and a single lateral field plate 1032 and a dielectric structure 1040 buried in a substrate 1002 remote from the gate electrode structure 1007 according to at least one aspect of the present disclosure. FIG. 12 is a top view of the buried gate HEMT 1000 shown in FIG. 11 according to at least one aspect of the present disclosure. With reference now to FIGS. 11 and 12, a buried gate HEMT 1000 is disclosed in which the drain current is carried via a 2 DEG plane within a channel 1010. As shown, the channel 1010 comprises multiple conducting channels. The buried gate HEMT 1000 comprises a substrate 1002, an epitaxial buffer layer 1022, a 2 DEG plane within an epitaxial channel 1010, an epitaxial top barrier layer 1020, and source and drain electrodes 1004, 1006 on a top surface of the substrate 1002. A gate electrode structure on the surface of the substrate 1002 comprises a plurality of buried gate electrode structures 1007, the tops of which extend above the top surface of the substrate 1002 and the bottoms of which are buried in an aperture 1036 disposed in the substrate 1002 to a depth at least equal to that of the bottom of 2 DEG plane of the channel 1010 between a dielectric layer 1012 disposed on the sidewalls of the channel 1010. The buried gate electrode structures 1007 also includes a head portion above (not shown) and not in contact with the top surface of the substrate, which contacts and interconnects all of the buried gate electrode structures 1007. Thus, the buried gate electrodes 1008 contact the 2 DEG plane of the channel 1010 only from the sides. When so arranged, the drain current of the FET is controlled by channel width modulation by lateral gating of the 2 DEG plane of the channel 1010 by the buried gate electrodes 1008. The drain current in the ON-state is controlled by channel width modulation, and the device exhibits excellent electrostatic isolation in the OFF-state because the buried gate electrodes 1008 laterally extend the depletion region under the 2 DEG plane of the channel 1010. In the illustrated example, the gate electrode structures 1007 are located asymmetrically closer to the source electrode 1004 end of the substrate 1002. A plurality of channels 1010 are defined between the source electrode 1004 and the drain electrode 1006 between the gate electrode structures 1007.

In the example depicted in FIGS. 11 and 12, the gate electrodes 1008 and the lateral field plate 1032 are rectangularly shaped and arranged in an asymmetric configuration. The buried gate electrodes 1008 and the lateral field plate 1032 are not limited to the shape in the depicted example. Each gate electrode 1008 comprises a lateral field plate 1032 extending longitudinally from the gate electrode 1008 towards to the drain electrode 1006 end along the length (L) of the substrate 1002. The amount of longitudinal extension along the length (L) of the lateral field plate 1032 is non-limiting and may be selected for a given application. A dielectric layer 1012 is disposed on the inner sidewalls of the aperture 1036 where the bottoms of the gate electrode structures 1007 are buried in the substrate 1002. The lateral sides of the bottom of the gate electrodes 1008 are received in the apertures 1036 through gaps 1034 defined in the dielectric layer 1012 disposed along the elongated sides of the apertures 1036. The dielectric layer 1012 surrounds the sidewalls of the apertures 1036 containing the gate electrode structures 1007 except where the gaps 1034 are defined. The buried gate electrodes 1008 contact laterally with the channel(s) 1010 along the width (W) and modulate the channel widths laterally with gate voltage bias. The lateral field plate 1032 is located adjacent to the transistor's gate electrode 1008 with a dielectric layer 1012 in between the lateral field plate 1032 and the channel(s) 1010.

The lateral field plate 1032 is adjacent to at least one of the plurality of gate electrodes 1008 buried in the substrate 1002. The lateral field plate 1032 is in contact with the drain electrode 1006 end of the gate electrode structure 1007 along an edge and is in contact with the dielectric 1012 sidewall in the lateral width (W) direction. The lateral field plate 1032 is configured to modulate an electric field proximal to a field plate region proximal to the gate electrode 1008 proximal to the drain electrode 1006 end of at least one of the plurality of gate electrode structures 1007 buried in the substrate 1002. Throughout this description, the term "lateral" is defined as the direction along the width (W) of the substrate 1002 and "longitudinal" is defined as the direction along the length (L) of the substrate 402.

A plurality of channels 1010 are located between the source electrode 1004 and the drain electrode 1006 between the gate electrode structures 1078. The lateral field plate 1032 creates an alleviated electric field in the lateral field plate region. The lateral field plate 1032 is in electrical contact with a lateral portion of the plurality of channels 1010 through the gate dielectric layer 1012. The alleviated electric field in the lateral field plate region is near the drain electrode 1006 end of the gate electrode structure 1007 and occurs when the device is biased at a high enough drain voltage, increasing breakdown voltage and suppressing current collapse. An alleviated electric field in the lateral field plate region is smaller than an electric field produced without a lateral field plate.

Electrons flow between the buried gate electrode structures 1007, with the width of the channels (Wch), measured between the buried gate electrode structures 1007 along the width (W) of the substrate 1002, controlled by the depletion induced by the lateral sides of the bottom of the buried gate electrode structures 1007, and by the pitch ("Pg-g") between adjacent buried gate electrode structures 1007. The preferably nanometer-scale parallel channels reduce self-heating during large signal operation by spatially distributing the heat sources. The width (W) is transverse to the length (L) of the substrate 1002. The buried gate electrodes 1008 contact laterally with the channel(s) defined between the gate electrode structures 1007 along the width (W) and modulate the channel widths Wch laterally with the gate bias.

The channel 1010 of the buried gate HEMT 1000 illustrated in FIG. 11, comprises a 2 DEG plane. For this type of FET, the bottoms of the buried gate electrode structures 1007 should be buried at least to the bottom of the 2 DEG plane of the channel 1010. As the 2 DEG plane occupies only the upper portion of the channel layer, the bottoms of the buried gate electrode structures 1007 can be within the channel 1010, or even in the buffer layer 1022.

The depth to which the buried gate electrode structures 1007 should be buried depends on the device type. The bottoms of the buried gate electrode structures 1007 should be buried to a depth at least equal to the bottom of the current-carrying 2 DEG plane in the channel 1010. If the device is a MESFET, the buried gate electrode structures 1007 could be buried to a depth at least equal to the bottom of the channel 1010. In general, the buried gate electrode structures 1007 must be buried deep enough so that they contact the current-carrying portion of the channel 1010 only from its sides, such that the drain current of the FET is controlled by channel width modulation by lateral gating of the current-carrying layer by the buried gate electrode structures 1007.

An FET employing buried gate electrode structures 1007 as described herein controls drain current via channel width modulation, by laterally gating the channel 1010. The laterally extended depletion region under the channel 1010 enhances electrostatic isolation, and reduces leakage current and drain-induced barrier lowering (DIBL) in the off-state; it also reduces output conductance in on-state, thereby improving transistor gain. Effective source and drain resistances are very small (~⅕ those of planar HEMTs) because the source and drain contact width is wider than the effective channel width, thereby reducing the knee voltage. In addition, having no contact between the top of substrate 1002 and the head portion (not shown) suppresses the electron trapping effect during large signal operation, and eliminates the inverse piezoelectric effect.

The buried gate electrode structures 1007 can have any of a number of shapes. For example, the structures may be cylindrical. They might also be, for example, rectangular, or any other suitable shape.

As shown in FIG. 11, the plurality of buried gate electrode structures 1007 may lie along a line which is parallel to and between the source and drain electrodes 1004, 1006, though this is not essential. In this example, the buried gate electrode structures 1007 are evenly spaced along said line (i.e., the buried gates have a fixed pitch). As FET characteristics such as threshold voltage vary with pitch, the fixed pitch can be selected as needed to achieve desired performance characteristics.

The dielectric layer 1012 is in contact with the sidewalls of the channel 1010 where the bottoms of the buried gate electrode structures 1007 are buried in the substrate 1002 down into the channel 1010. The dielectric layer 1012 also is in contact with the top surface of the substrate 1002. The buried gate electrode structures 1007 modulate the drain current by a vertical gate field. This forms a lateral field plate region at the drain electrode 1006 end of the buried gate electrode structures 1007 where an electric field strength is alleviated during high voltage operation. Alleviation of the high electric field strength in this lateral field plate region 1014 prevents current collapse by electron trapping at the semiconductor surface and enhances the power performance of the buried gate HEMT 1000 when it is biased at high drain voltages.

To alleviate the high electric field strength in regions, the lateral field plates 1032 are integrated with the gate electrodes 1008 and a dielectric layer 1012 is inserted in between the lateral field plates 1032 and the channel 1010. The thickness of the dielectric layer 1012 determines the pinch-off voltage in the lateral field plate region. The lateral field plates 1032 alleviate the electric field in the regions 1014 near the drain electrode 1006 end of the gate electrodes 1008 when the buried gate HEMT 1000 is biased at a high drain voltage, increasing breakdown voltage and suppressing current collapse. In addition, the substrate 1002 comprises buried dielectric structures 1040 located remote from the gate electrode structures 1007 to enhance breakdown voltage and reduce the gate-to-drain capacitance. The buried dielectric structures 1040 shape the equipotential lines 1042 developed between the dielectric layers 1012 of adjacent gate electrodes 1008 to increase breakdown voltage and suppress current collapse. In one aspect, the buried dielectric structures 1040 are made of nitride.

Laterally-gated transistors with multiple channels 1010, as shown in FIGS. 11 and 12, for example, increase the power density and current handling of the transistor to decrease the on-resistance of the transistor for both RF and power switching applications. In the laterally-gated transistors, the field lateral field plates 1032 contacts laterally with the channel(s) 1010 through a gate dielectric layer 1012 made of SiN, SiO2, SiON, AlN, Al2O3, AlON, HfO2, HfN, or HfON, for example. The thickness of the gate dielectric layer 1012 deposited on the sidewalls is made to be the same in the depth direction, enabling the distance between the lateral field plates 1032 and the channel 1010 to be the same for multiple channels.

It will be appreciated that any of the gate electrode structures 407, 507, 607, 707, 807, 907, 1007 comprising gate electrodes 408, 508, 608, 708, 808, 908, 1008 adjacent to corresponding lateral field plates 432, 532, 533, 632, 732, 733, 832, 833, 932, 933, 1032 configurations may be implemented in the top gate FET configuration described in connection with FIG. 3. In these implementations, the dielectric layer 312 is inserted in between the lateral field plates 432, 532, 533, 632, 732, 733, 832, 833, 932, 933, 1032 and the channel layer 320. In a top gate implementation, the gate electrode structures 407, 507, 607, 707, 807, 907, 1007 may be arranged in symmetric or asymmetric configurations relative to the substrate.

In view of the foregoing description, in various aspects, the dielectric layer material 112, 212, 312, 412, 512, 612, 712, 812, 912, 1012 may be selected from any one of the following materials SiN, SiO2, SiON, AlN, Al2O3, AlON, HfO2, HfN, or HfON.

In view of the foregoing description, in various aspects, the semiconductor substrate material may be selected from any one of the following semiconductor materials SiC, GaN, AlN, GaAs, InP, Ga2O3, Si.

In view of the foregoing description, in various aspects, the buffer layer material may be selected from any one of the following materials: GaN, AlGaN, AlN, InGaN, InAlN, GaAs, InGaAs, InAlAs, InP AlGaAs, InGaOx, Ga2O3, AlGaOx, Si, SiGe.

In view of the foregoing description, in various aspects, the channel layer material may be selected from any one of the following materials: GaN, AlGaN, InGaN, InAlN, GaAs, InGaAs, InAlAs, InP, AlGaAs, InGaOx, Ga2O3, AlGaOx, Si, SiGe.

In view of the foregoing description, in various aspects, the barrier layer material may be selected from any one of the following materials: GaN, AlGaN, InGaN, InAlN, GaAs, InGaAs, InAlAs, InP, AlGaAs, Ga2O3, AlGaOx, Si, SiGe.

As noted above, the present FET structure may be used to form, for example, HEMTs or MESFETs. HEMTs that might employ the device structure described herein might be disposed from various combinations of substrates and epitaxial layer materials. Several possible material combinations are listed below; other combinations may also be possible.

1. AlGaN barrier/GaN channel/GaN or AlGaN buffer on SiC, Si, GaN, AlN, sapphire, or diamond substrate;
2. AlGaAs barrier/InGaAs channel/GaAs or AlGaAs buffer on GaAs substrate;
3. InAlAs barrier/InGaAs channel/InP or InAlAs buffer on InP substrate; and
4. (AlGa)2O3 barrier/Ga2O3 channel/Ga2O3 buffer on Ga2O3 substrate.

In other aspects, the present disclosure is directed to Schottky diodes comprising lateral contacts. In one aspect, a Schottky diode comprises a lateral contact between the anode metal and a single or multiple 2 DEG channel layer or layers. Lateral field plates are added in between the anode and the cathode to laterally pinch off the multiple 2 DEG channels simultaneously, leading to an increased breakdown voltage. A single or multiple lateral field plate(s) can be used to establish an electric field between the anode and the cathode.

Figure 13:
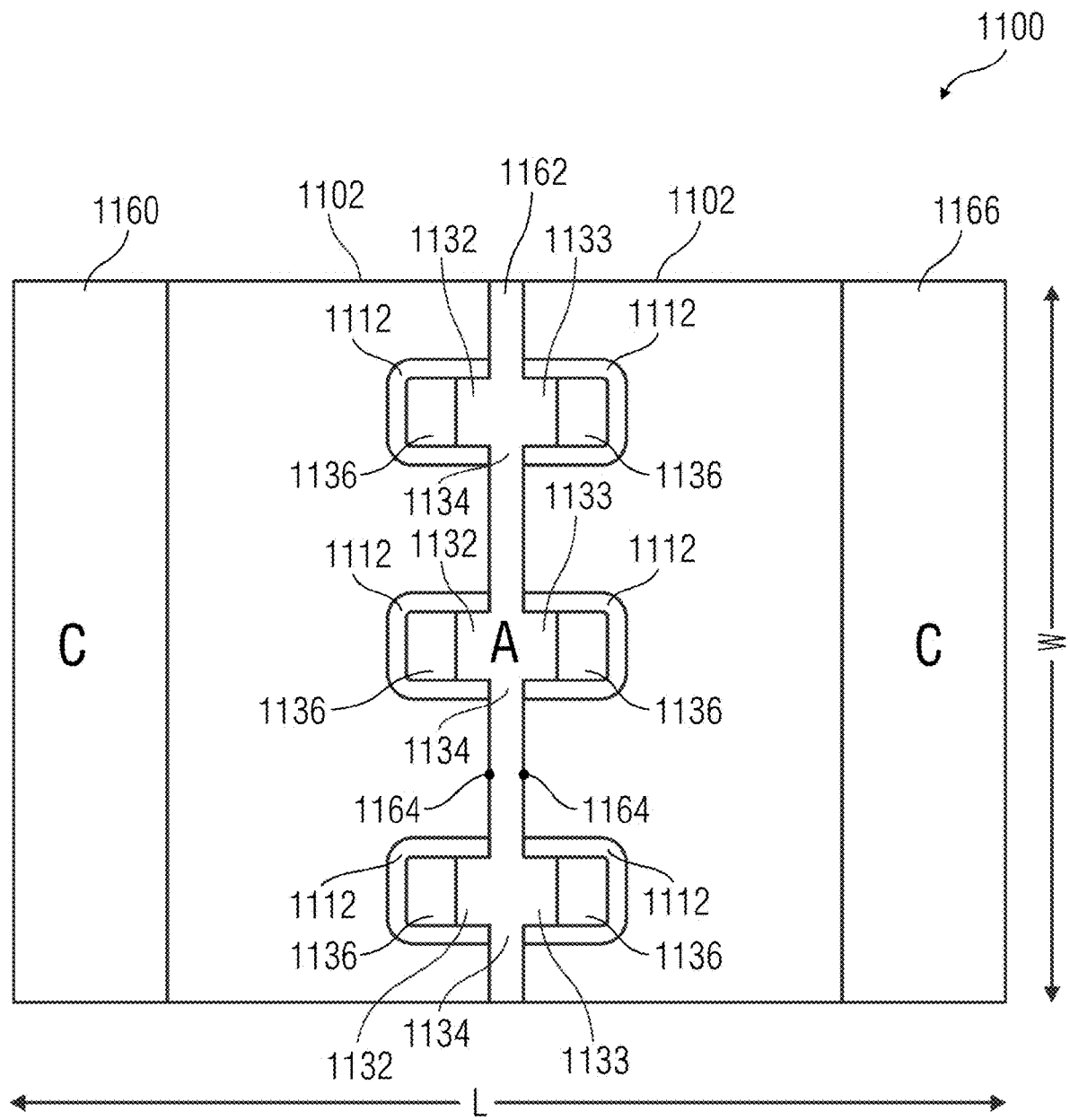
FIG. 13 is a top view of a lateral Schottky diode with an anode structure comprising an anode (A) and lateral field plates according to at least one aspect of the present disclosure.

Turning now to the figures, FIG. 13 is a top view of a lateral Schottky diode 1100 with an anode structure comprising an anode (A) 1162 and lateral field plates 1132, 1133 according to at least one aspect of the present disclosure. The lateral Schottky diode 1100 comprises a substrate 1102 and cathodes (C) 1160, 1166. The cathodes 1160, 1166 are located on the top surface of the substrate 1102. The substrate 1102 comprises a plurality of structures buried in apertures 1136 disposed in the substrate 1102. The anode 1162 is located symmetrically between the cathodes 1160, 1166.

In the example depicted in FIG. 13, the first and second lateral field plates 1132, 1133 are rectangularly shaped and arranged in a symmetric configuration. The first and second lateral field plates 1132, 1133 are not limited to the shape in the depicted example. The first lateral field plate 1132 extends longitudinally from the anode 1162 towards the cathode 1160 along length (L) of the substrate 1102. The second lateral field plate 1133 extends longitudinally from the anode 1162 towards the cathode 1166 along the length (L) of the substrate 1102. The first and second lateral field plates 1132, 1133 extend laterally along the width (W) direction of the substrate 1102.

A dielectric layer 1112 is disposed on the inner sidewalls of the apertures 1136 where the bottoms of the anode structure are buried in the substrate 1102 down into the channel(s). The lateral sides of the bottoms of the anode 1162 are received within the apertures 1136 through the gaps 1134 defined in the dielectric layers 1112 along the longitudinal sides of the apertures 1136. The dielectric layers 1112 surround the sidewalls of the apertures 1136 containing the anode 1162 except where the gaps 1134 are defined in the aperture 1136.

The first lateral field plate 1132 is located adjacent to the anode 1162 proximal to the cathode 1160 and extends longitudinally towards the cathode along the length (L) direction of the substrate 1102. The second lateral field plate 1133 is located adjacent to the anode 1162 proximal to the cathode 1166 and extends longitudinally towards the cathode 1166 along the length (L) direction of the substrate 1102. The dielectric later 1112 is disposed on the sidewalls of the apertures 1136.

The lateral field plates 1132, 1133 disposed between the anode 1162 and the cathode 1160, 1166 laterally pinch off the multiple 2 DEG channels simultaneously, leading to an increased breakdown voltage. A single or multiple field plate(s) can be used to establish an electric field between the anode 1162 and the cathode 1160, 1166. To do so, two lateral field plates 1132, 1133 are integrated symmetrically with the anode 1162. The dielectric layer 1112 is disposed between the first lateral field plate 1132 and the channel. For at least one of the anode structures, the first and second lateral field plates 1132, 1133 are configured to establish an electric field between the anode 1162 and the cathode 1160. The thickness of the dielectric layer 1112 determines the pinch-off voltage in the lateral field plate region. The lateral field plates 1132, 1133 establish an electric field in the lateral field plate regions near the cathodes 1160, 1166. Along the anode 1162 are the Schottky contacts 1164.

Figure 14:
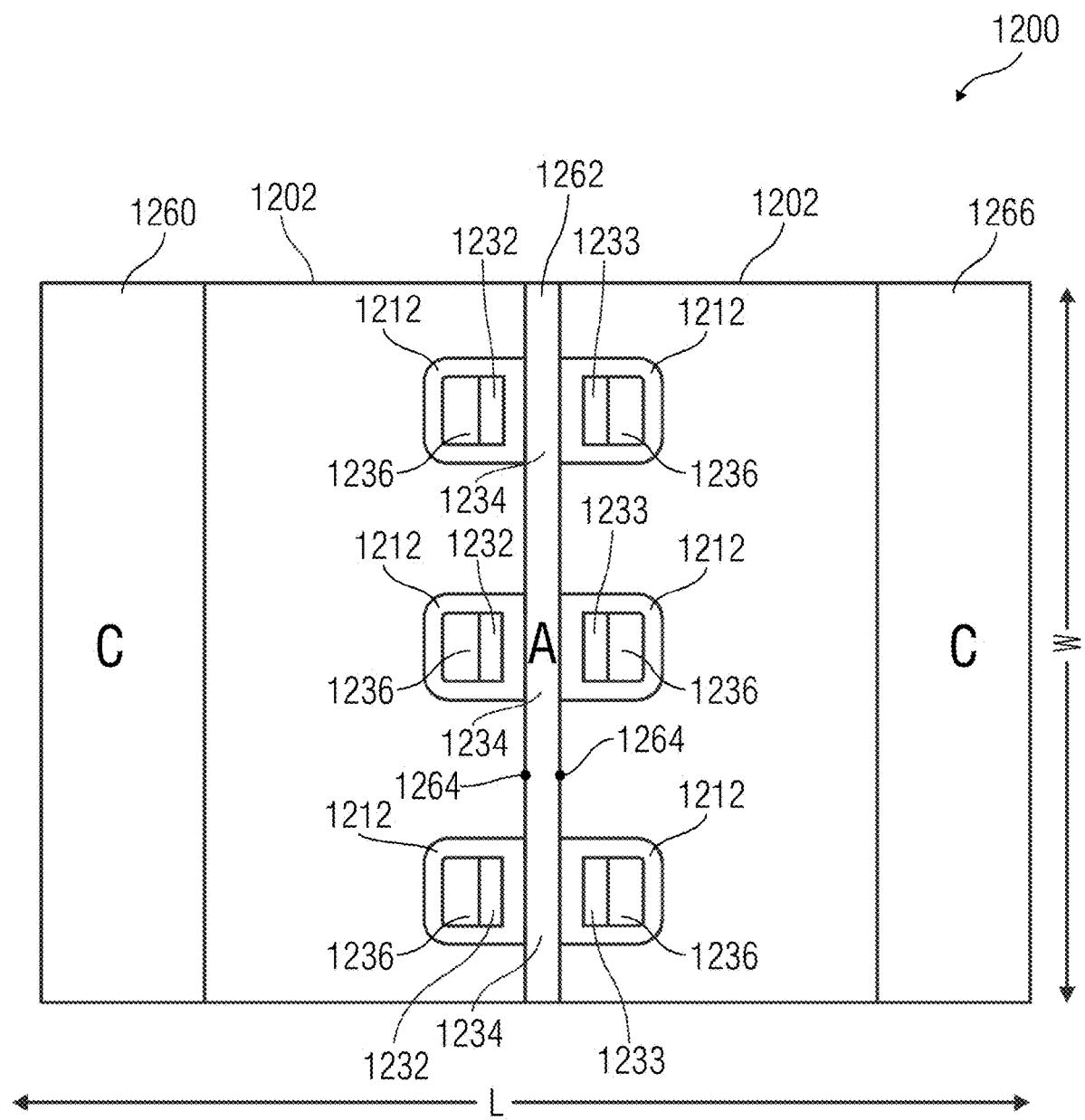
FIG. 14 is a top view of a lateral Schottky diode with an anode structure comprising an anode (A) and lateral field plates according to at least one aspect of the present disclosure.

FIG. 14 is a top view of a lateral Schottky diode 1200 with an anode structure comprising an anode (A) 1262 and lateral field plates 1232, 1233 according to at least one aspect of the present disclosure. The lateral Schottky diode 1200 comprises a substrate 1202 and cathodes (C) 1260, 1266. The cathodes 1260, 1266 are located on the top surface of the substrate 1202. The substrate 1202 comprises a plurality of structures buried in apertures 1236 disposed in the substrate 1202. The anode 1262 is located symmetrically between the cathodes 1260, 1266.

In the example depicted in FIG. 14, the first and second lateral field plates 1232, 1233 are rectangularly shaped and arranged in a symmetric configuration. The first and second lateral field plates 1232, 1233 are not limited to the shape in the depicted example. The first lateral field plate 1232 is separated from the anode 1262 by a dielectric layer 1212 and extends longitudinally towards the cathode 1260 along length (L) of the substrate 1202. The second lateral field plate 1233 is separated from the anode 1262 by the dielectric layer 1212 and extends longitudinally towards the cathode 1266 along the length (L) of the substrate 1202. The first and second lateral field plates 1232, 1233 extend laterally along the width (W) direction of the substrate 1202.

The dielectric layer 1212 is disposed on the inner sidewalls of the apertures 1236 where the bottoms of the anode structure are buried in the substrate 1202 down into the channel(s). The lateral sides of the bottoms of the anode 1262 are received within the apertures 1236 through the gaps 1234 defined in the dielectric layers 1212 along the longitudinal sides of the apertures 1236. The dielectric layers 1212 surround the sidewalls of the apertures 1236 including sidewall portions of the anode 1236 in the lateral direction along the width (W) of the substrate 1202 except where the gaps 1234 are defined in the apertures 1236.

The first lateral field plate 1232 is separated from the anode 1262 by the dielectric layer 1212 and extends longitudinally towards the cathode 1260 along the length (L) direction of the substrate 1202. The second lateral field plate 1233 is separated from the anode 1262 by the dielectric layer 1212 and extends longitudinally towards the cathode 1266 along the length (L) direction of the substrate 1202. The dielectric later 1212 is disposed on the sidewalls of the apertures 1236.

The lateral field plates disposed between the anode 1262 and the cathode 1260, 1266 laterally pinch off the multiple 2 DEG channels simultaneously, leading to an increased breakdown voltage. A single or multiple field plate(s) can be used to establish an electric field between the anode 1262 and the cathode 1260, 1266. To do so, two lateral field plates 1232, 1233 are disposed symmetrically on either side of the anode 1262. The dielectric layer 1212 is disposed between the first lateral field plate 1232 and the channel. For at least one of the anode structures, the first and second lateral field plates 1232, 1233 are configured to establish an electric field between the anode 1262 and the cathode 1260, 1266. The thickness of the dielectric layer 1212 determines the pinch-off voltage in the lateral field plate region. The lateral field plates 1232, 1233 establish an electric field in the lateral field plate regions near the cathodes 1260. Along the anode 1262 are the Schottky contacts 1264.

Figure 15:
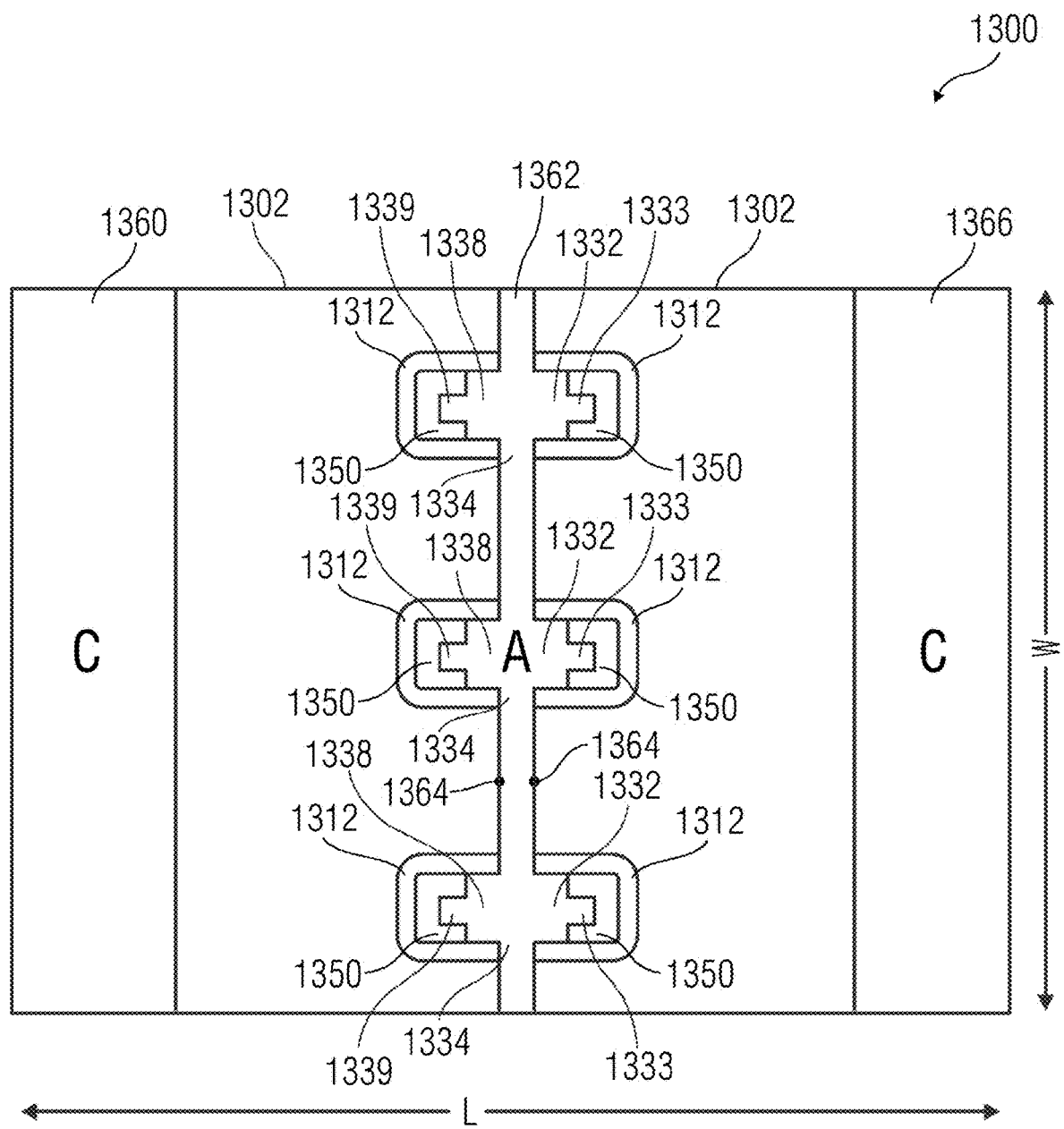
FIG. 15 is a top view of a lateral Schottky diode with an anode structure comprising an anode (A) and lateral field plates according to at least one aspect of the present disclosure.

FIG. 15 is a top view of a lateral Schottky diode 1300 with an anode structure comprising an anode (A) 1362 and lateral field plates 1332, 1333, 1338, 1339 according to at least one aspect of the present disclosure. The lateral Schottky diode 1300 comprises a substrate 1302 and cathodes (C) 1360, 1366. The cathodes 1360, 1366 are located on the top surface of the substrate 1302. The substrate 1302 comprises a plurality of structures buried in apertures disposed in the substrate 1302. The anode 1362 is located symmetrically between the cathodes 1360, 1366.

In the example depicted in FIG. 15, the four lateral field plates 1332, 1333, 1338, 1339 are rectangularly shaped and arranged in a symmetric configuration. The four lateral field plates 1332, 1333, 1338, 1339 are not limited to the shape in the depicted example. The first and second lateral field plates 1332, 1133 extend longitudinally from the anode 1362 towards the cathode 1366 along length (L) of the substrate 1302. The third and fourth lateral field plates 1338, 1339 extend longitudinally from the anode 1362 towards the cathode 1360 along the length (L) of the substrate 1302. The four lateral field plates 1332, 1333, 1338, 1339 extend laterally along the width (W) direction of the substrate 1302.

A first dielectric layer 1312 is disposed on the inner sidewalls of the apertures where the bottoms of the anode structure are buried in the substrate 1302 down into the channel(s). The lateral sides of the bottoms of the anode 1362 are received within the apertures through the gaps 1334 defined in the first dielectric layer 1312 along the longitudinal sides of the apertures. The first dielectric layers 1312 surround the sidewalls of the apertures containing the anode 1362 except where the gaps 1334 are defined in the apertures. A second dielectric layer 1350 is disposed on the inner sidewalls of the first dielectric layer 1312.

The first lateral field plate 1332 is located adjacent to the anode 1362 proximal to the cathode 1366 and extends longitudinally towards the cathode along the length (L) direction of the substrate 1302. The second lateral field plate 1333 is located adjacent to the first lateral field plate 1332 proximal to the cathode 1366 and extends longitudinally towards the cathode 1366 along the length (L) direction of the substrate 1302. The third lateral field plate 1338 is located adjacent to the anode 1362 proximal to the cathode 1360 and extends longitudinally towards the cathode 1360 along the length (L) direction of the substrate 1302. The fourth lateral field plate 1339 is located adjacent to the third lateral field plate 1338 proximal to the cathode 1360 and extends longitudinally towards the cathode 1360 along the length (L) direction of the substrate 1302. The dielectric layer 1312 is disposed on the sidewalls of the apertures .

The lateral field plates disposed between the anode 1362 and the cathode 1360, 1366 laterally pinch off the multiple 2 DEG channels simultaneously, leading to an increased breakdown voltage. A single or multiple field plate(s) can be used to establish an electric field between the anode and the cathode. To do so, four lateral field plates 1332, 1333, 1338, 1339 are integrated symmetrically with the anode 1362. The first dielectric layer 1312 is disposed between the first and third lateral field plates 1332, 1338 and the channel. The first and third lateral field plates 1332, 1338 laterally contact the first dielectric layer 1312 and longitudinally contact the second dielectric layer 1350. The second and fourth lateral field plates 1333, 1339 laterally and longitudinally contact the second dielectric layer 1350. For at least one of the anode structures, the four lateral field plates 1332, 1333, 1338, 1339 are configured to establish an electric field between the anode 1362 and the cathode 1360, 1366. The thickness of the dielectric layers 1312, 1350 determines the pinch-off voltage in the lateral field plate region. The lateral field plates 1332, 1333, 1338, 1339 establish an electric field in the lateral field plate regions near the cathodes 1360, 1366. Along the anode 1362 are the Schottky contacts 1364.

Figure 16:
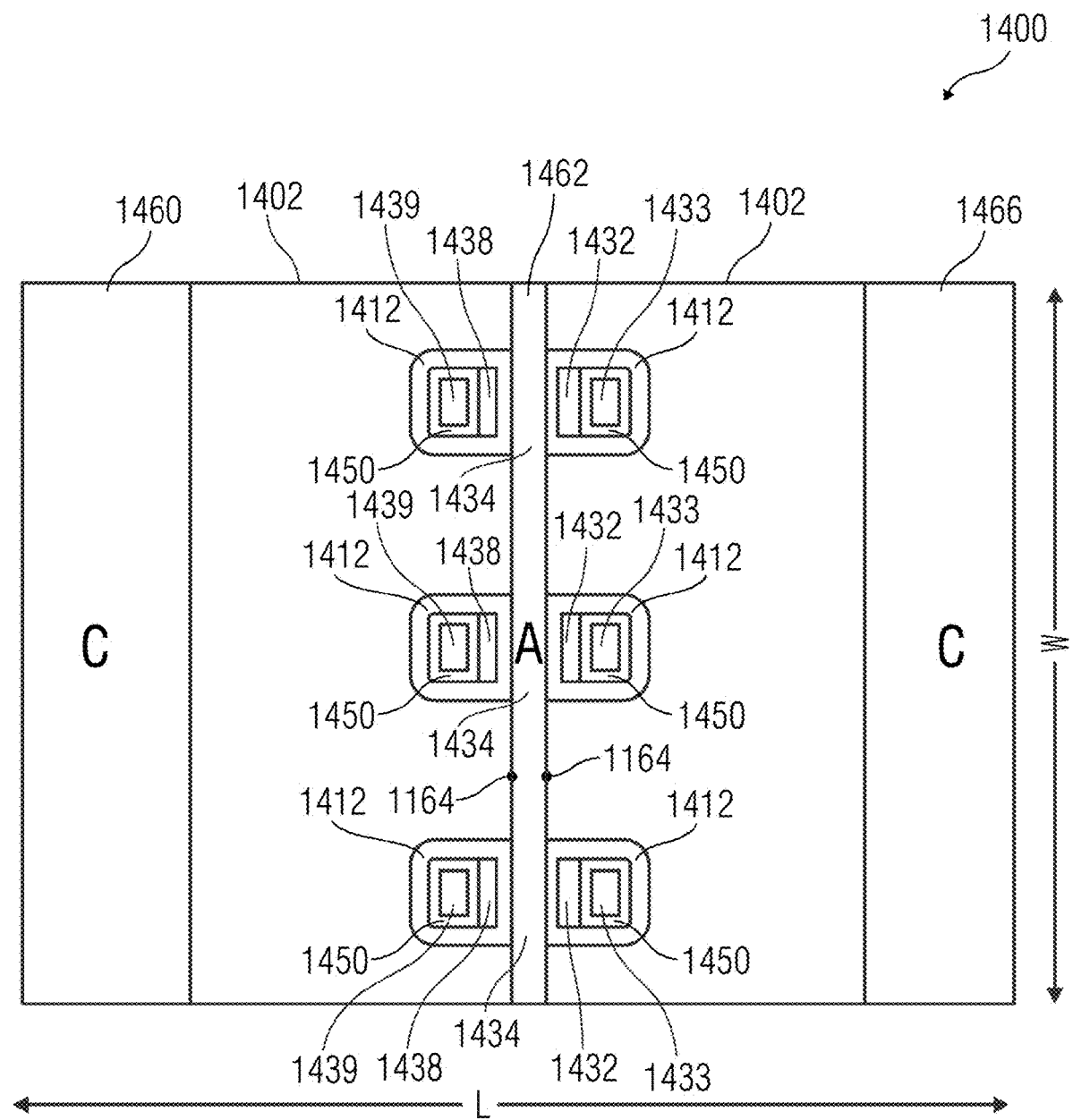
FIG. 16 is a top view of a lateral Schottky diode with an anode structure comprising an anode (A) and lateral field plates according to at least one aspect of the present disclosure.

FIG. 16 is a top view of a lateral Schottky diode 1400 with an anode structure comprising an anode (A) 1462 and lateral field plates 1432, 1433, 1438, 1439 according to at least one aspect of the present disclosure. The lateral Schottky diode 1400 comprises a substrate 1402 and cathodes (C) 1460, 1466. The cathodes 1460, 1466 are located on the top surface of the substrate 1402. The substrate 1402 comprises a plurality of structures buried in apertures disposed in the substrate 1402. The anode 1462 is located symmetrically between the cathodes 1460, 1466.

In the example depicted in FIG. 16, the four lateral field plates 1432, 1433, 1438, 1439 are rectangularly shaped and arranged in a symmetric configuration. The four lateral field plates 1432, 1433, 1438, 1439 are not limited to the shape in the depicted example. The first and second lateral field plates 1432, 1433 extend longitudinally from the anode 1462 towards the cathode 1466 along length (L) of the substrate 1402. The third and fourth lateral field plates 1438, 1439 extend longitudinally from the anode 1462 towards the cathode 1460 along the length (L) of the substrate 1402. The four lateral field plates 1432, 1433, 1438, 1439 extend laterally along the width (W) direction of the substrate 1402.

A first dielectric layer 1412 is disposed on the inner sidewalls of the apertures where the bottoms of the anode structure are buried in the substrate 1402 down into the channel(s). A second dielectric layer 1450 is disposed on the inner sidewalls of the first dielectric layer 1412. The lateral sides of the bottoms of the anode 1462 are received within the apertures through the gaps 1434 defined in the dielectric layers 1412 along the longitudinal sides of the apertures. The first dielectric layers 1412 surround the sidewalls of the apertures including the sides of the anode 1462 along the width (W) direction except where the gaps 1434 are defined in the aperture. A second dielectric layer 1450 is disposed along the sidewalls of the apertures, about the sidewalls of the second and fourth lateral field plate 1433, 1439, and in between the sidewalls of the first and second lateral field plates 1432, 1433, and in between the sidewalls of the third and fourth lateral field plates 1438, 1439.

The first lateral field plate 1432 is located adjacent to the anode 1462 separated by a portion of the first dielectric layer 1412 proximal to the cathode 1466 and extends longitudinally towards the cathode 1466 along the length (L) direction of the substrate 1402. The first lateral field plate 1432 contacts the first dielectric layer 1412 on three sides and contacts the second dielectric layer 1450 on the side proximal to the cathode 1466. The second lateral field plate 1433 is located adjacent to the first lateral field plate 1432 proximal to the cathode 1466 and extends longitudinally towards the cathode 1466 along the length (L) direction of the substrate 1402 and contacts the second dielectric layer 1450 on all four sides. The second lateral field plate 1432 does not contact the first dielectric layer 1412. The third lateral field plate 1438 is located adjacent to the anode 1462 separated by a portion of the first dielectric layer 1412 proximal to the cathode 1460 and extends longitudinally towards the cathode 1460 along the length (L) direction of the substrate 1402. The third lateral field plate 1438 contacts the first dielectric layer 1412 on three sides and contacts the second dielectric layer 1450 on the side proximal to the cathode 1460. The fourth lateral field plate 1439 is located adjacent to the third lateral field plate 1438 proximal to the cathode 1460 and extends longitudinally towards the cathode 1460 along the length (L) direction of the substrate 1402 and contacts the second dielectric layer 1450 on all four sides. The fourth lateral field plate 1439 does not contact the first dielectric layer 1412. The dielectric layer 1412 is disposed on the sidewalls of the apertures.

The lateral field plates disposed between the anode 1462 and the cathode 1460, 1466 laterally pinch off the multiple 2 DEG channels simultaneously, leading to an increased breakdown voltage. A single or multiple field plate(s) can be used to establish an electric field between the anode and the cathode. To do so, four lateral field plates 1432, 1433, 1438, 1439 are integrated symmetrically with the anode 1462. The first dielectric layer 1412 is disposed between the first and third lateral field plate 1432, 1438 and the channel(s) and the second dielectric layer 1450 is inserted between the second lateral field plate 1433 and the first dielectric layer 1412 and between the first and second lateral field plates 1432, 1433, and the second dielectric layer is inserted between the fourth lateral field plate 1439 and the first dielectric layer 1412 and between the third and fourth lateral field plates 1438, 1439. For at least one of the anode structures, the first lateral field plate 1432 laterally contacts the first dielectric layer 1412 and the second lateral field plate 1433 laterally contacts the second dielectric layer 1450, while the third lateral field plate 1438 laterally contacts the first dielectric layer 1412 and the fourth lateral field plate 1438 laterally contacts the second dielectric layer 1450. The thickness of the dielectric layer 1412, 1450 determines the pinch-off voltage in the lateral field plate region. The lateral field plates 1432, 1433, 1438, 1439 establish an electric field in the lateral field plate regions near the cathodes 1460, 1466. Along the anode 1462 are the Schottky contacts 1464.

EXAMPLES

Examples of various aspects of end-effectors and surgical instruments of the present disclosure are provided below. An aspect of the end-effector or surgical instrument may include any one or more than one, and any combination of, the examples described below:

Example 1. A field-effect transistor (FET), comprising a substrate; source and drain electrodes on the substrate; a channel layer; a gate electrode structure comprising: a gate electrode in contact with the channel layer; and a first lateral field plate adjacent to the gate electrode; and a first dielectric layer disposed between the first lateral field plate and the channel layer; wherein the first lateral field plate is in contact with the first dielectric layer and is configured to modulate an electric field proximal to the gate electrode proximal to at least one of or both the drain or source electrodes.

Example 2. The FET of Example 1, wherein the gate electrode and the first lateral field plate are disposed on a surface of the substrate.

Example 3. The FET of any one of Examples 1-2, wherein a thickness of the first dielectric layer determines a pinch-off voltage in a field plate region proximal to the gate electrode structure.

Example 4. The FET of any one of Examples 1-3, wherein the gate electrode and the first lateral field plate comprise top and bottom portions, wherein the bottom portions of the gate electrode and the first lateral field plate are buried in an aperture defined in the substrate to a depth extending to the channel layer and the top portions of the gate electrode and the first lateral field plate extend above a surface of the substrate.

Example 5. The FET of Example 4, wherein the apertures define sidewalls and the first dielectric layer is disposed on the sidewalls except in lateral gaps disposed in the first dielectric layer configured to receive the bottom portion of the gate electrode such that the gate electrode is in lateral contact with the channel.

Example 6. The FET of Example 5, wherein the aperture and the gate electrode structure are disposed in an asymmetric arrangement on the substrate between the source and drain electrodes.

Example 7. The FET of Example 6, wherein the gate electrode structure is disposed in an asymmetric arrangement within the aperture.

Example 8. The FET of Example 7, wherein the first lateral field plate extends longitudinally from the gate electrode and the bottom portion of the first lateral field plate is in lateral contact with the first dielectric layer.

Example 9. The FET of any one of Examples 7-8, further comprising: a second dielectric layer disposed on sidewalls defined by the first dielectric layer; and a second latera field disposed adjacent to the first lateral field plate; wherein the first lateral field plate laterally contacts the first dielectric layer and longitudinally contacts the second dielectric layer; wherein the second lateral field plate laterally contacts the second dielectric layer; and wherein a thickness of the first and second dielectric layers determines a pinch-off voltage in the field plate region.

Example 10. The FET of any one of Examples 7-9, wherein the first dielectric layer is further disposed on sidewalls defined by the bottom portion of the gate electrode in a lateral direction along a width (W) of the substrate and wherein the first lateral field plate is separated from the gate electrode by a portion of the first dielectric layer.

Example 11. The FET of Example 10, further comprising: a second dielectric layer disposed over the first dielectric layer; and a second lateral field plate adjacent to the first lateral field plate, wherein the second lateral field plate is in lateral contact with the second dielectric layer and is separated from the first lateral field plate by a portion of the second dielectric layer.

Example 12. A field-effect transistor (FET), comprising: a substrate; source and drain electrodes on the substrate; a channel layer; a gate electrode structure comprising: a gate electrode in contact with the channel; a first lateral field plate adjacent to one side of the gate electrode; and a second lateral field plate adjacent to an opposite side of the gate electrode; wherein the first and second lateral field plates are disposed in a symmetrical arrangement relative to the gate electrode; and a first dielectric layer disposed between the first and second lateral field plates and the channel layer; wherein the first and second lateral field plates are in contact with the first dielectric layer and are configured to modulate an electric field proximal to the gate electrode proximal to at least one of or both the drain or source electrodes.

Example 13. The FET of Example 12, wherein the gate electrode and the first and second lateral field plates are disposed on a surface of the substrate.

Example 14. The FET of any one of Examples 12-13, wherein a thickness of the first dielectric layer determines a pinch-off voltage in a field plate region proximal to the gate electrode structure.

Example 15. The FET of any one of Examples 12-14, wherein the gate electrode and the first and second lateral field plates comprise top and bottom portions, wherein the bottom portions of the gate electrode and the first and second lateral field plates are buried in an aperture defined in the substrate to a depth extending to the channel layer and the top portions of the gate electrode and the first and second lateral field plates extend above a surface of the substrate.

Example 16. The FET of Example 15, wherein the apertures define sidewalls and the first dielectric layer is disposed on the sidewalls except in lateral gaps disposed in the first dielectric layer configured to receive the bottom portion of the gate electrode such that the gate electrode is in lateral contact with the channel.

Example 17. The FET of any one of Examples 12-16, further comprising: a second dielectric layer disposed over the first dielectric layer; a third lateral field plate adjacent to the first lateral field plate; and a fourth lateral field plate adjacent to the second lateral field plate; wherein the third and fourth lateral field plates are in lateral contact with the second dielectric layer.

Example 18. A field-effect transistor (FET), comprising: a substrate; source and drain electrodes on the substrate; a channel layer; a gate electrode structure comprising: a gate electrode in contact with the channel layer; and a first lateral field plate adjacent to the gate electrode; a first dielectric layer disposed between the first lateral field plate and the channel layer; and a dielectric structure buried in the substrate remote from the gate electrode structure; wherein the first lateral field plate is in contact with the first dielectric layer and is configured to modulate an electric field proximal to the gate electrode proximal to at least one of or both the drain or source electrodes.

Example 19. The FET of Example 18, wherein the buried dielectric structures shape equipotential lines developed between the first dielectric layer adjacent to the gate electrode structure.

Example 20. The FET of any one of Examples 18-19, wherein the gate electrode and the first lateral field plate comprise top and bottom portions, wherein the bottom portions of the gate electrode and the first lateral field plate are buried in an aperture defined in the substrate to a depth extending to the channel layer and the top portions of the gate electrode and the first lateral field plate extend above a surface of the substrate, and wherein the first lateral field plate extends longitudinally from the gate electrode and the bottom portion of the first lateral field plate is in lateral contact with the first dielectric layer.

Example 21. A lateral Schottky diode, comprising: a substrate comprising a plurality of structures buried in apertures disposed in the substrate; an anode structure comprising: an anode; and lateral field plates; and a cathode located on a top surface of the substrate.

Example 22. The lateral Schottky diode of Example 21, further comprising another cathode wherein the anode is located symmetrically between the cathodes.

Example 23. The lateral Schottky diode of any one of Examples 21-22, wherein the first and second lateral field plates are rectangularly shaped and arranged in a symmetric configuration.

Example 24. The lateral Schottky diode of any one of Example 21-23, wherein a first lateral field plate extends longitudinally from the anode towards the cathode along a length (L) of the substrate, a second lateral field plate extends longitudinally from the anode towards the cathode along the length (L) of the substrate, wherein the first and second lateral field plates extend laterally along a width (W) of the substrate.

Example 25. The lateral Schottky diode of any one of Examples 21-24, further comprising a dielectric layer disposed on inner sidewalls of the apertures, wherein bottom portions of the anode are buried in the substrate.

Example 26. The lateral Schottky diode of any one of Examples 21-25, wherein the lateral field plates are located between the anode and the cathode.

While several forms have been illustrated and described, it is not the intention of Applicant to restrict or limit the scope of the appended claims to such detail. Numerous modifications, variations, changes, substitutions, combinations, and equivalents to those forms may be implemented and will occur to those skilled in the art without departing from the scope of the present disclosure. Moreover, the structure of each element associated with the described forms can be alternatively described as a means for providing the function predisposed by the element. Also, where materials are disclosed for certain components, other materials may be used. It is therefore to be understood that the foregoing description and the appended claims are intended to cover all such modifications, combinations, and variations as falling within the scope of the disclosed forms. The appended claims are intended to cover all such modifications, One or more components may be referred to herein as "configured to," "configurable to," "operable/operative to," "adapted/adaptable," "able to," "conformable/condisposed to," etc. Those skilled in the art will recognize that "configured to" can generally encompass active-state components and/or inactive-state components and/or standby-state components, unless context requires otherwise.

The terms "proximal" and "distal" are used herein with reference to a clinician manipulating the handle portion of the surgical instrument. The term "proximal" refers to the portion closest to the clinician and the term "distal" refers to the portion located away from the clinician. It will be further appreciated that, for convenience and clarity, spatial terms such as "vertical", "horizontal", "up", and "down" may be used herein with respect to the drawings. However, surgical instruments are used in many orientations and positions, and these terms are not intended to be limiting and/or absolute.

Those skilled in the art will recognize that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that any recited operations therein may generally be predisposed in any order. Also, although various operational flow diagrams are presented in a sequence (s), it should be understood that the various operations may be predisposed in other orders than those which are illustrated, or may be predisposed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "an exemplification," "one exemplification," and the like means that a particular feature, structure, or characteristic described in connection with the aspect is included in at least one aspect. Thus, appearances of the phrases "in one aspect," "in an aspect," "in an exemplification," and "in one exemplification" in various places throughout the specification are not necessarily all referring to the same aspect. Furthermore, the particular features, structures or characteristics may be combined in any suitable manner in one or more aspects.

Any patent application, patent, non-patent publication, or other disclosure material referred to in this specification and/or listed in any Application Data Sheet is incorporated by reference herein, to the extent that the incorporated materials is not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

The invention claimed is:

1. A field-effect transistor (FET), comprising:
   a substrate;
   a source electrode and a drain electrode disposed on the substrate;
   a channel layer;
   a gate electrode structure comprising:
      a gate electrode in contact with the channel layer;
      a first lateral field plate adjacent to one side of the gate electrode; and
      a second lateral field plate adjacent to an opposite side of the gate electrode;
      wherein the first and second lateral field plates are disposed in a symmetrical arrangement relative to the gate electrode; and
   a first dielectric layer disposed between the first and second lateral field plates and the channel layer; and
   wherein the first and second lateral field plates are in contact with the first dielectric layer and are configured to modulate an electric field proximal to the gate electrode proximal to at least one of the drain electrode or the source electrode, or both the drain electrode and the source electrode, and
   wherein the gate electrode and the first and second lateral field plates comprise top portions and bottom portions, wherein the bottom portions of the gate electrode and the first and second lateral field plates are buried in an aperture defined in the substrate to a depth extending to the channel layer and the top portions of the gate electrode and the first and second lateral field plates extend above a surface of the substrate.

2. The FET of claim 1, wherein the gate electrode and the first and second lateral field plates are disposed on a surface of the substrate.

3. The FET of claim 1, wherein a thickness of the first dielectric layer determines a pinch-off voltage in a field plate region proximal to the gate electrode structure.

4. The FET of claim 1, wherein the aperture defines sidewalls and the first dielectric layer is disposed on the sidewalls except in lateral gaps disposed in the first dielectric layer configured to receive the bottom portions of the gate electrode such that the gate electrode is in lateral contact with the channel layer.

5. The FET of claim 4, wherein the first dielectric layer is further disposed on sidewalls defined by the bottom portion of the gate electrode in a lateral direction along a width (W) of the substrate.

6. A field-effect transistor (FET), comprising:
a substrate;
a source electrode and a drain electrode disposed on the substrate;
a channel layer;
a gate electrode structure comprising:
  a gate electrode in contact with the channel layer;
  a first lateral field plate adjacent to one side of the gate electrode; and
  a second lateral field plate adjacent to an opposite side of the gate electrode;
  a third lateral field plate disposed adjacent to the first lateral field plate; and
  a fourth lateral field plate disposed adjacent to the second lateral field plate;
  wherein the first and second lateral field plates are disposed in a symmetrical arrangement relative to the gate electrode; and
a first dielectric layer disposed between the first and second lateral field plates and the channel layer; and
wherein the first and second lateral field plates are in contact with the first dielectric layer and are configured to modulate an electric field proximal to the gate electrode proximal to at least one of the drain electrode or the source electrode, or both the drain electrode and the source electrode, and
wherein the gate electrode and the first and second lateral field plates comprise top portions and bottom portions, wherein the bottom portions of the gate electrode and the first and second lateral field plates are buried in an aperture defined in the substrate to a depth extending to the channel layer and the top portions of the gate electrode and the first and second lateral field plates extend above a surface of the substrate.

7. The FET of claim 6, wherein the gate electrode and the first and second lateral field plates are disposed on a surface of the substrate.

8. The FET of claim 6, wherein a thickness of the first dielectric layer determines a pinch-off voltage in a field plate region proximal to the gate electrode structure.

9. The FET of claim 6, wherein the aperture defines sidewalls and the first dielectric layer is disposed on the sidewalls except in lateral gaps disposed in the first dielectric layer configured to receive the bottom portions of the gate electrode such that the gate electrode is in lateral contact with the channel layer.

10. The FET of claim 6 wherein the first dielectric layer defines sidewalls, and wherein the FET further comprises a second dielectric layer disposed on the sidewalls of the first dielectric layer.

11. The FET of claim 10, wherein the first, second, third, and fourth lateral field plates contact the second dielectric layer.

12. The FET of claim 6, wherein the third and fourth lateral field plates are arranged symmetrically relative to the gate electrode.

13. A field-effect transistor (FET), comprising:
a substrate;
a source electrode and a drain electrode disposed on the substrate;
a channel layer;
an aperture defined in the substrate to a depth extending to the channel layer, wherein the aperture defines sidewalls;
a gate electrode structure comprising:
  a gate electrode in contact with the channel layer;
  a first lateral field plate adjacent to one side of the gate electrode; and
  a second lateral field plate adjacent to an opposite side of the gate electrode;
  wherein the first and second lateral field plates are disposed in a symmetrical arrangement relative to the gate electrode; and
a first dielectric layer disposed on the sidewalls except in lateral gaps disposed in the first dielectric layer configured to receive a bottom portion of the gate electrode such that the gate electrode is in lateral contact with the channel layer; and
wherein the first and second lateral field plates are in contact with the first dielectric layer and are configured to modulate an electric field proximal to the gate electrode proximal to at least one of the drain electrode or the source electrode, or both the drain electrode and the source electrode, and
wherein the gate electrode and the first and second lateral field plates comprise top portions and bottom portions, wherein the bottom portions of the gate electrode and the first and second lateral field plates are buried in an aperture defined in the substrate to a depth extending to the channel layer and the top portions of the gate electrode and the first and second lateral field plates extend above a surface of the substrate.

14. The FET of claim 13, wherein the gate electrode further comprises:
  a third lateral field plate disposed adjacent to the first lateral field plate; and
  a fourth lateral field plate disposed adjacent to the second lateral field plate.

15. The FET of claim 14, wherein the first dielectric layer defines sidewalls, and wherein the FET further comprises a second dielectric layer disposed on the sidewalls of the first dielectric layer.

16. The FET of claim 15, wherein the first, second, third, and fourth lateral field plates contact the second dielectric layer.

17. The FET of claim 13, wherein the gate electrode and the first and second lateral field plates are disposed on a surface of the substrate.

18. The FET of claim 14, wherein the third and fourth lateral field plates comprise top portions and bottom portions, wherein the bottom portions of the gate electrode and the third and fourth lateral field plates are buried in the aperture defined in the substrate and the top portions of the gate electrode and the third and fourth lateral field plates extend above a surface of the substrate.

* * * * *